(12) United States Patent
Singla

(10) Patent No.: US 11,419,228 B2
(45) Date of Patent: Aug. 16, 2022

(54) LOCKING MECHANISMS IN SEPARABLE AND REPAIRABLE DEVICES

(71) Applicant: Microsoft Technology Licensing, LLC, Redmond, WA (US)

(72) Inventor: Aseem Singla, Bothell, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1171 days.

(21) Appl. No.: 15/944,296

(22) Filed: Apr. 3, 2018

(65) Prior Publication Data

US 2019/0307005 A1 Oct. 3, 2019

(51) Int. Cl.
| | |
|---|---|
| *H05K 5/02* | (2006.01) |
| *F16B 5/06* | (2006.01) |
| *G06F 1/16* | (2006.01) |
| *G06F 1/18* | (2006.01) |
| *H05K 5/00* | (2006.01) |
| *F16B 1/00* | (2006.01) |

(52) U.S. Cl.
CPC ......... *H05K 5/0221* (2013.01); *F16B 5/0607* (2013.01); *G06F 1/1658* (2013.01); *G06F 1/1679* (2013.01); *G06F 1/183* (2013.01); *G06F 1/185* (2013.01); *F16B 2001/0035* (2013.01); *G06F 1/1626* (2013.01); *H05K 5/0017* (2013.01); *Y10T 403/606* (2015.01)

(58) Field of Classification Search
CPC ............ F16B 5/0607; F16B 2001/0035; F16B 2005/0678; H05K 5/0221; H05K 7/1401; H05K 7/1405; Y10T 403/60; Y10T 403/606; Y10T 403/608

See application file for complete search history.

(56) References Cited

U.S. PATENT DOCUMENTS

| | | | | |
|---|---|---|---|---|
| 5,485,733 A | * | 1/1996 | Hoffman | E05B 47/004 70/276 |
| 5,608,980 A | * | 3/1997 | Pangerl | G09F 15/0018 292/251.5 |
| 6,098,938 A | | 8/2000 | Tsai | |
| 6,147,878 A | | 11/2000 | Heselton | |

(Continued)

OTHER PUBLICATIONS

"International Search Report and Written Opinion Issued in PCT Application No. PCT/US19/023794", dated Jun. 25, 2019, 14 Pages.

(Continued)

*Primary Examiner* — Michael P Ferguson
(74) *Attorney, Agent, or Firm* — Ray Quinney & Nebeker P.C.; Paul N. Taylor

(57) ABSTRACT

Locking mechanisms and separable, repairable (e.g., electronic) devices having locking mechanisms are described herein. In one example, a locking mechanism includes a chassis having a base, a first side wall extending from a surface of the base, and a second side wall extending from the surface of the base. A cavity is provided in a volume formed by the first side wall, the second side wall, and the surface of the base, wherein the cavity is configured to receive a mating component of the device. The locking mechanism also includes a cantilevered plate having a first end and a second, opposite end, wherein the cantilevered plate is attached to the first side wall of the chassis at or adjacent to the first end, and wherein the second end of the cantilevered plate is positioned with the cavity.

8 Claims, 12 Drawing Sheets

(56) References Cited

U.S. PATENT DOCUMENTS

| | | |
|---|---|---|
| 6,456,501 B1 | 9/2002 | Rubenstein et al. |
| 6,920,976 B2 * | 7/2005 | Sykes ................. E05B 73/0023 |
| | | 206/308.2 |
| 7,106,582 B2 | 9/2006 | Albrecht et al. |
| 7,217,059 B1 * | 5/2007 | Rudduck ............... F16B 5/0664 |
| | | 403/324 |
| 7,540,244 B2 | 6/2009 | Gregory |
| 7,944,690 B2 * | 5/2011 | Yamagiwa ........... H05K 5/0013 |
| | | 361/679.58 |
| 8,297,872 B2 * | 10/2012 | Wei ....................... F16B 21/073 |
| | | 403/330 |
| 8,337,234 B2 | 12/2012 | Sasaki et al. |
| 8,602,465 B2 * | 12/2013 | Holmgren ........... E05B 15/0093 |
| | | 292/251.5 |
| 8,840,334 B2 | 9/2014 | Huang et al. |
| 9,040,847 B2 * | 5/2015 | Liang .................... G06F 1/1626 |
| | | 174/500 |
| 9,425,543 B2 | 8/2016 | Sprenger et al. |
| 10,738,813 B2 * | 8/2020 | Jung .................... H05K 5/0221 |
| 2010/0307904 A1 | 12/2010 | Yeh et al. |
| 2016/0094095 A1 | 3/2016 | Hong |
| 2016/0095233 A1 | 3/2016 | Kusumi |
| 2016/0149340 A1 | 5/2016 | Chang |
| 2017/0006727 A1 * | 1/2017 | Ryu .......................... G09F 9/33 |

OTHER PUBLICATIONS

"Handbook of Plastics Joining: A Practical Guide", In Publication of Cambridge University Press, Oct. 23, 2008, 1 Page.

* cited by examiner

LOCKING MECHANISMS IN SEPARABLE AND REPAIRABLE DEVICES

BACKGROUND

Current design trends for electronic devices such as tablet computers, display devices, or mobile phones include designs having an increase in power, a decrease in size (e.g., height, length, and/or width), and an increase in speed. As the size of the electronic device is reduced, certain internal device components may be positioned closer together. This provides for challenges in manufacturing design, including design challenges in constructing a device without visible screws, holes, or access points.

Similar design trends are possible in other industries as well where access to internal components and ease of repair is important. For example, certain design trends within the electronic industry may also be attributable to the automotive industry.

For example, in certain commercial examples, a display screen may be adhered to a chassis of an electronic device (e.g., tablet computer). Such adhesive retention solutions, while low-profile, induce display failure at high rates when disassembled. Alternative, low-profile solutions that attempt to address disassembly failure require time-costly manual mechanisms.

SUMMARY

Locking mechanisms and separable, repairable (e.g., electronic) devices having such locking mechanisms are described herein. In one or more embodiments, the locking mechanism includes a chassis having a base, a first side wall extending from a surface of the base, and a second side wall extending from the surface of the base. The locking mechanism also includes a cavity provided in a volume formed by the first side wall, the second side wall, and the surface of the base, wherein the cavity is configured to receive a mating component of the electronic device. The locking mechanism also includes a cantilevered plate having a first end and a second, opposite end, wherein the cantilevered plate is attached to the first side wall of the chassis at or adjacent to the first end, and wherein the second end of the cantilevered plate is positioned with the cavity. The cantilevered plate is configured to bend at or adjacent to the second end, therein moving between a locked position and an unlocked position, wherein the mating component of the electronic device is securable in the locked position and removable in the unlocked position.

In another embodiment, a separable and repairable (e.g., electronic) device includes a chassis having a base, a first side wall extending from a surface of the base, and a second side wall extending from the surface of the base. The electronic device also includes a cavity provided in a volume formed by the first side wall, the second side wall, and the surface of the base. The electronic device also includes a cantilevered plate having a first end and a second, opposite end, wherein the cantilevered plate is attached to the first side wall of the chassis at or adjacent to the first end, wherein the second end of the cantilevered plate is positioned with the cavity, and wherein the cantilevered plate is configured to bend at or adjacent to the second end, therein moving between a locked position and an unlocked position. The electronic device also includes a substrate having a mating component extending from a surface of the substrate, wherein the mating component is positionable within the cavity, and wherein the substrate is securable in the locked position and removable in the unlocked position.

In another embodiment, a locking mechanism includes a chassis having a base, a first side wall extending from a surface of the base, and a second side wall extending from the surface of the base. The locking mechanism also includes a cavity provided in a volume formed by the first side wall, the second side wall, and the surface of the base. The locking mechanism also includes a mating component having a first end attached to a substrate and a second, opposite end positionable within the cavity. The locking mechanism also includes a retaining device positioned on the first or second side wall, wherein the retaining device is configured to receive a portion of the mating component within the cavity and secure the mating component in a locked position, wherein the mating component is configured to bend at or adjacent to the second end, therein moving the locking mechanism between the locked position and an unlocked position, wherein the substrate and mating component are removable from the chassis in the unlocked position.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DESCRIPTION OF THE DRAWING FIGURES

For a more complete understanding of the disclosure, reference is made to the following detailed description and accompanying drawing figures, in which like reference numerals may be used to identify like elements in the figures.

Figure 1:
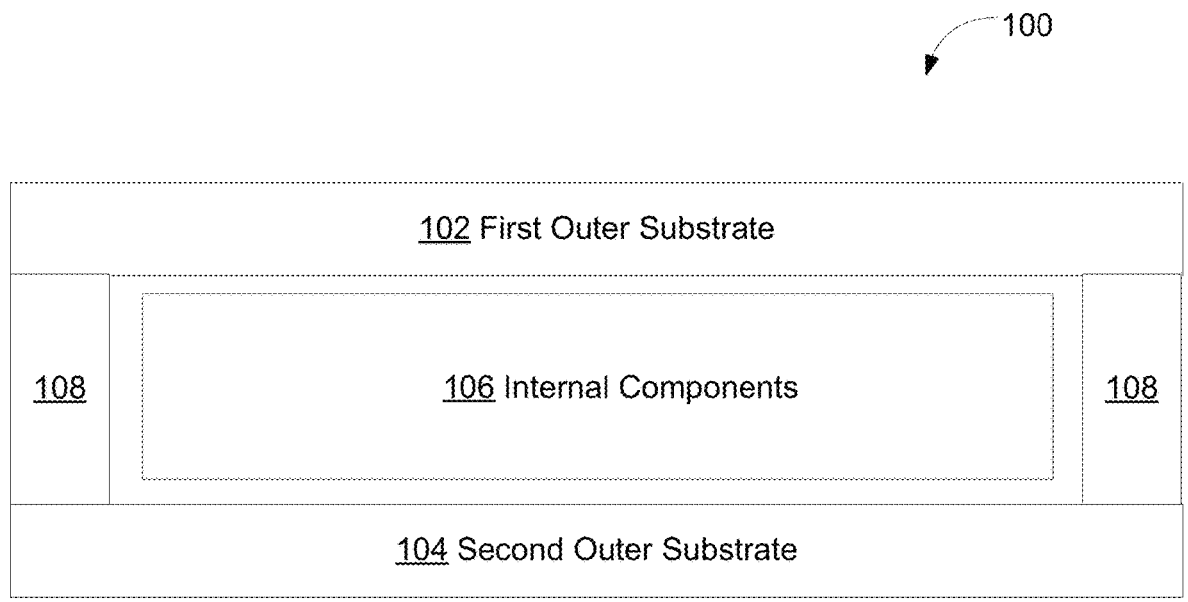
FIG. 1 depicts an example of a cross-sectional side view of an electronic device.
Figure 1:
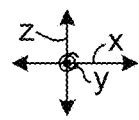

While the disclosed devices and systems are representative of embodiments in various forms, specific embodiments are illustrated in the drawings (and are hereafter described), with the understanding that the disclosure is intended to be illustrative and is not intended to limit the claim scope to the specific embodiments described and illustrated herein.

DETAILED DESCRIPTION

Locking mechanisms and separable, repairable (e.g., electronic) devices having such locking mechanisms are described herein. Such locking mechanisms have several potential end-uses or applications, including handheld electronic devices. For example, the locking mechanism is advantageous in providing streamlined ease-of-detachment and reduced electronic device failure rates. In other words, the use of a cantilevered plate or latch to secure two detachable components of the electronic device may reduce or eliminate the use of an adhesive material to adhere the first component (e.g., a chassis or intermediate layer) of the electronic device to the second component (e.g., a display screen) of the device. By reducing or eliminating the use of adhesive materials, one component (e.g., display screen) may be mechanically removed from the remainder of the electronic device by moving the cantilevered plate or latch (e.g., via a permanent magnet) without damage to the device components. This may be advantageous in reducing repair or rework costs, as the time required to repair the electronic device may be reduced and the number of damaged components may also be reduced. This is also advantageous in preventing the use of additional materials (e.g., adhesive materials) to secure the device components together.

Additionally, the locking mechanism with a cantilevered plate or latch may be advantageous in being able to construct an electronic device with minimal real-estate. That is, the installation of the locking mechanism within an electronic device may have a minimal height or thickness difference of the device in comparison to a similar electronic device without the locking mechanism. Additionally, or alternatively, the installation of the locking mechanism within the electronic device may have a similar or smaller border width or length in comparison to a similar electronic device without the locking mechanism, as the compared electronic device may require adhesive materials to secure the components in place, whereas less or no adhesive materials may be required in the device with the locking mechanism.

The locking mechanism may be incorporated into a device having at least one external surface configured to be safely removed from the remainder of the device, therein allowing access to internal components of the device. In some examples, the locking mechanism may be incorporated into any device where ease of repair is important (such as, for example, an automotive part or an electronic device). For example, the locking mechanism may be incorporated into any separable, repairable (e.g., electronic) device with at least one external surface configured to be safely removed from the remainder of the (e.g., electronic) device. Non-limiting examples of electronic devices include personal computers (PCs), server computers, tablet and other handheld computing devices, laptop or mobile computers, communication devices such as mobile phones, multiprocessor systems, microprocessor-based systems, set top boxes, programmable consumer electronics, network PCs, minicomputers, mainframe computers, or audio or video media players. In certain examples, the electronic device may be a wearable electronic device, wherein the device may be worn on or attached to a person's body or clothing. The wearable device may be attached to a person's shirt or jacket; worn on a person's wrist, ankle, waist, or head; or worn over their eyes or ears. Such wearable devices may include a watch, heart-rate monitor, activity tracker, or head-mounted display.

Various non-limiting examples of locking mechanisms and separable, repairable (e.g., electronic) devices including the locking mechanisms are described in greater detail below.

FIG. 1 depicts a cross-sectional view of an electronic device 100 configurable to include a locking mechanism. The electronic device 100 includes a first outer layer or substrate 102. In certain examples, the first outer layer or substrate 102 is an input device, such as a keyboard. In other examples, the first outer substrate 102 may be a display screen or display module. The display module 102 may be a touch display module. The display module 102 may include a light-emitting device such as a liquid crystal display (LCD) or a light emitting diode (LED) (e.g., an organic light emitting diode (OLED)). The LCD or LED may be disposed in, or configured as, a film. The configuration, construction, materials, and other aspects of the light emitting devices may vary. For instance, III-V semiconductor-based LED structures may be used to fabricate micron-sized LED devices. The small thickness of such structures allows the light emitting devices to be disposed in planar arrangements (e.g., on or in planar surfaces) and thus, distributed across the viewable area of the display. Non-LED technologies, such as finely tuned quantum dot-based emission structures, may also be used. Other thin form factor emission technologies, whether developed, in development, or future developed, may be used within the display module 102.

The electronic device 100 further includes a second outer substrate 104 (e.g., chassis or backing layer). The second outer substrate 104 is positioned on an opposite or rear end of the electronic device 100 such that the first outer substrate 102 (e.g., the display screen or input device) and the second outer substrate 104 (e.g., chassis or backing layer) bookend the internal components 106 of the electronic device. The first and second outer substrates may be connected to each other via borders 108 or sides of the electronic device. In some examples, the borders 108 may be an extension of the first or second outer substrate (e.g., part of the chassis). In other examples, the borders 108 are separate outer substrates of the electronic device.

In some examples, the second outer substrate 104 may be a backing layer or chassis. The chassis may be made of any variety of materials now known or later developed such as metals, plastics, polymers, ceramics, or combinations thereof. The chassis, for instance, may be formed from one or more sub-layers of a polymer or mixture of polymers. For example, the chassis may be formed from polymers such as thermoplastic polymers, silicones, or polyurethanes. In some examples, the chassis is formed from a polyurethane laminate, where a cloth fabric is laminated onto a thin film of polyurethane. In some examples, the second outer substrate 104 is formed of a material that does hinder an external magnet from interacting with an internal component of the locking mechanism (discussed below) to move the locking mechanism between a locked position and unlocked position. For example, the second outer substrate 104 may be a non-metallic or non-magnetic composition. In one particular example, the second outer substrate 104 is not steel.

In alternative examples, the second outer substrate 104 may be a display screen or display module as described above with reference to the first outer substrate 102.

Positioned between the first outer substrate 102 and the second outer substrate 104 are the internal components 106 of the electronic device 100. One internal component may be a circuit board or motherboard. The circuit board may be a printed circuit board or a flexible circuit board. The circuit board may be configured to hold and allow communication between one or more central processing units (CPUs), graphics processing units (CPUs), and memories. The circuit board may also be configured to provide connections to sound cards, video cards, network cards, hard drives, or other forms of storage. The circuit board may also be configured to provide connections to one or more peripherals (e.g., a keyboard, mouse, serial port, parallel port, Firewire/IEEE 1394a, universal serial bus (USB), Ethernet, audio). The circuit board and its connected components (e.g., CPU) may provide a source of the heat generated during operation of the electronic device (i.e., a heat source).

Another internal component within the electronic device 100 is the battery. In certain examples, the electronic device may include a plurality (i.e., two or more) of batteries. The battery may be any type of battery now known or later developed. In certain examples, the battery is a secondary or rechargeable battery (e.g., a metal ion or metal air battery such as a lithium air or lithium ion battery). In some examples, the battery may be in the same plane as the motherboard (e.g., the same x-y plane). In other examples, the battery may be in a different plane from the motherboard, wherein the battery plane is parallel with the motherboard plane (e.g., the x-y plane of the battery is at a different z height from the x-y plane of the motherboard).

The electronic device 100 may include additional internal components between the first outer substrate 102 (e.g., display module or input device) and the second outer substrate 104 (e.g., chassis or backing layer). For example, the electronic device 100 may include an active cooling source (e.g., a fan). As used herein, "active cooling" may refer to the use of forced fluid movement (e.g. fans moving air or pumps moving water) to reduce the heat of a component (e.g., a microprocessor) of the electronic device. Active cooling contrasts with "passive cooling," which utilizes non-forced methods of cooling such as natural convection or radiation or involves reducing the speed at which a component (e.g., a microprocessor) is running to reduce the component's heat. The fan, when active, may drive air through areas or channels within the internal area of the electronic device to assist in removing heat from the electronic device.

An additional internal component of the electronic device 100 may be at least one locking mechanism, which is configured to assist in the removal of the first outer substrate or the second outer substrate from the remainder of the electronic device 100. In some examples, the electronic device 100 includes a plurality of locking mechanisms, wherein each locking mechanism is configured to assist in the removal of a substrate from the remainder of the electronic device 100. For example, the electronic device 100 may include two locking mechanisms, wherein a first locking mechanism is configured to assist in the removal of the first outer substrate 102 and a second locking mechanism is configured to assist in the removal of the second outer substrate 104. Each locking mechanism may be similar or different from the additional locking mechanisms within the electronic device. The locking mechanisms may be individually activated or activated in a group.

Figure 2:
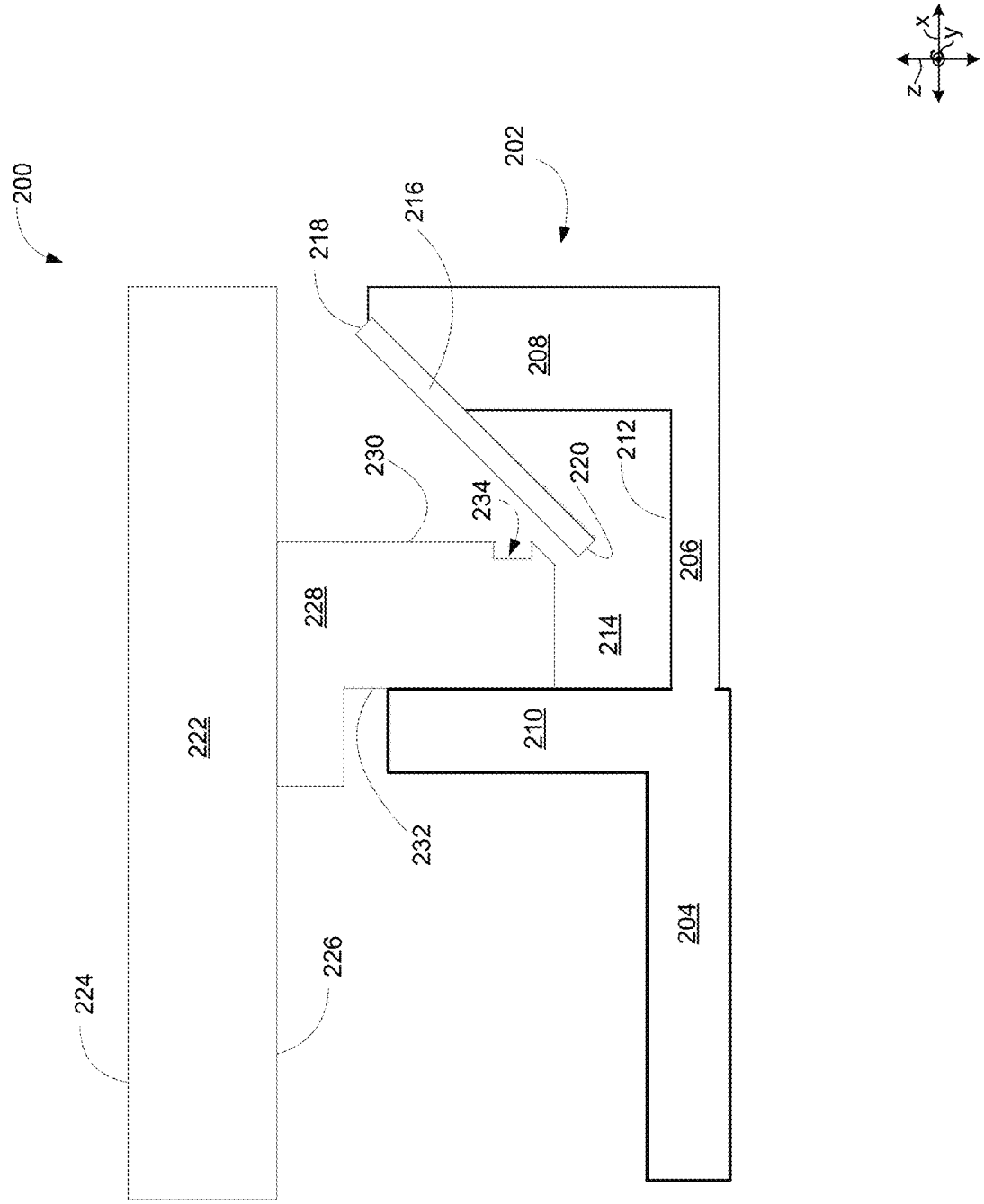
FIG. 2 depicts an example of a cross-sectional side view of a locking mechanism of an electronic device.
Figure 3:
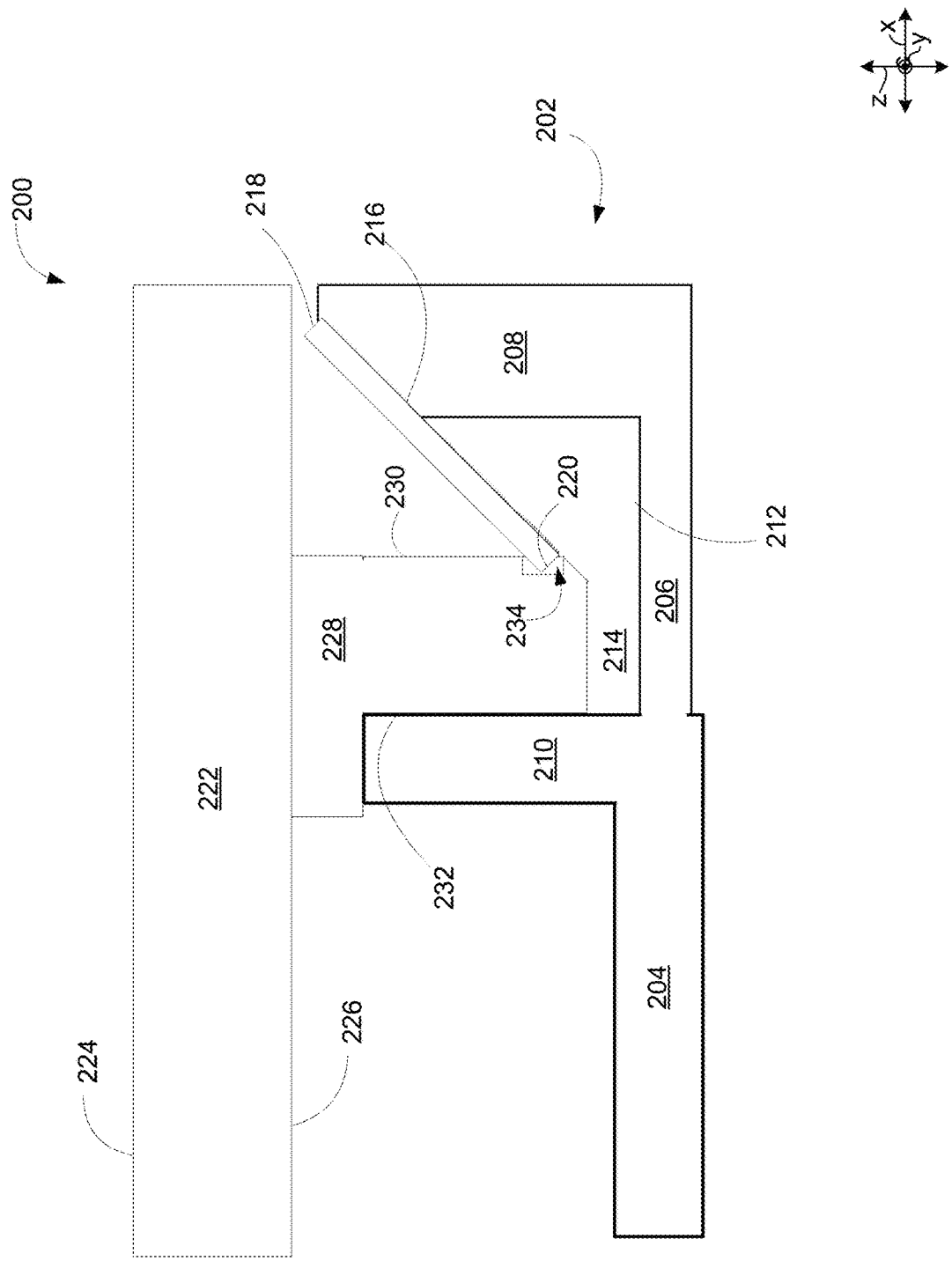
FIG. 3 depicts an example of a cross-sectional side view of the locking mechanism of an electronic device in a locked position.
Figure 4:
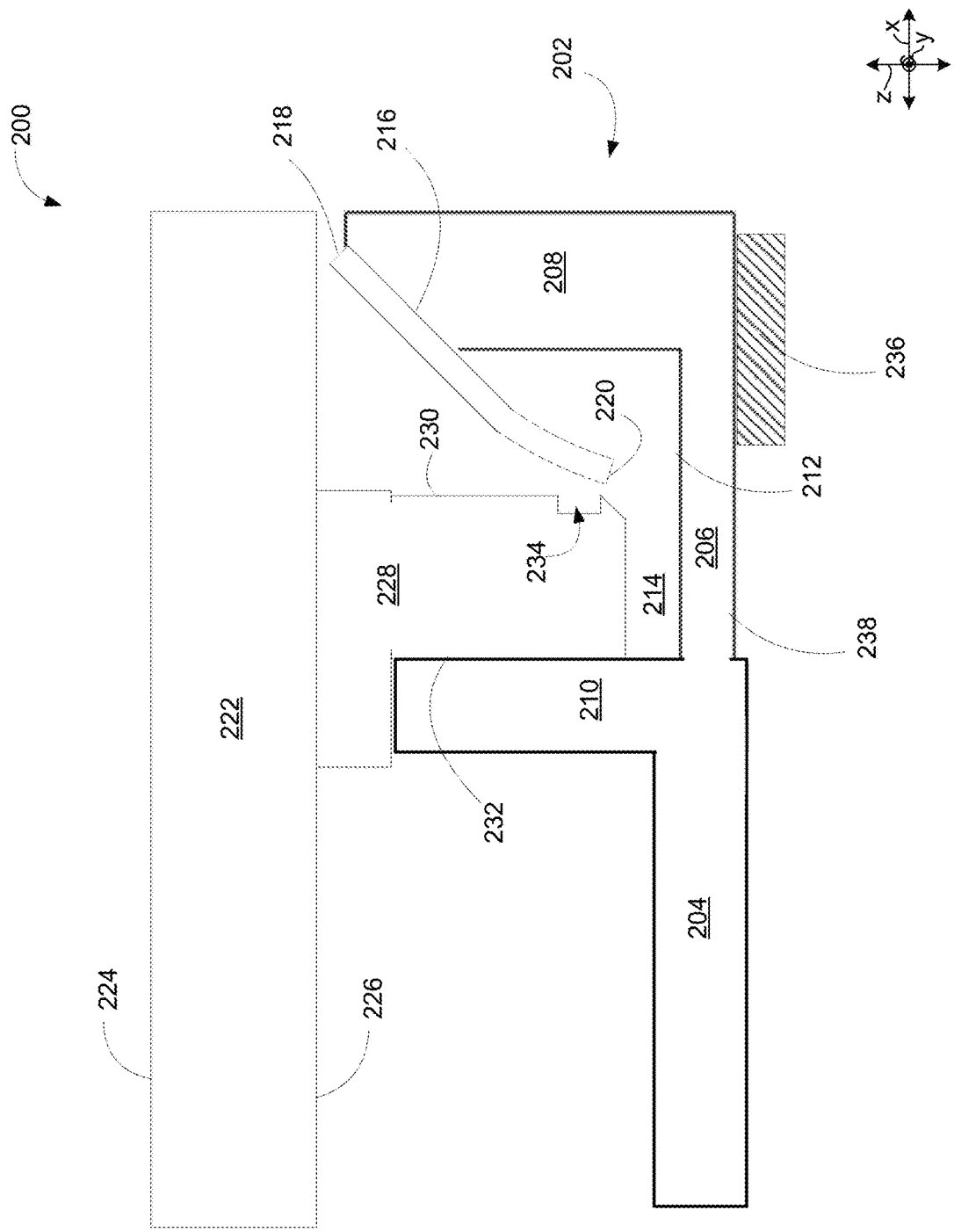
FIG. 4 depicts an example of a cross-sectional side view of a locking mechanism in an unlocked position.

FIGS. 2-4 depict an example of a cross-sectional side view of a locking mechanism 202 of an electronic device 200. FIG. 2 depicts the electronic device with a first substrate separated from the second substrate, FIG. 3 depicts the electronic device in a locked position, and FIG. 4 depicts the electronic device in an unlocked position.

As depicted in FIGS. 2-4, the locking mechanism 202 includes a first substrate 204 having a base 206, a first side wall 208 extending from a surface 212 of the base 206, and a second side wall 210 extending from the surface 212 of the base 206. The first substrate 204 may be a chassis or backing layer of the electronic device. Alternatively, the first substrate 204 may be a display module or input device. Alternatively, the first substrate 204 may be an internal substrate or layer of the electronic device 200.

The composition of the first substrate 204 may be any known or later developed material. For example, the first substrate 204 may be made of metals, plastics, polymers, ceramics, or combinations thereof. In some examples, the first substrate 204 (e.g., chassis or backing layer) or the base 206 of the first substrate 204 includes one or more sub-layers of a polymer or mixture of polymers. For example, the first substrate 204 or the base 206 of the first substrate 206 may be formed from polymers such as thermoplastic polymers, silicones, or polyurethanes. In some examples, the first substrate 204 or the base 206 of the first substrate 204 is formed from a polyurethane laminate, where a cloth fabric is laminated onto a thin film of polyurethane. Alternatively, the first substrate 204 or the base 206 of the first substrate 204 includes one or more metals or metal alloys such as aluminum, copper, iron, lead, magnesium, molybdenum, nickel, osmium, palladium, platinum, rhenium, rhodium, ruthenium, sliver, steel, tantalum, thorium, titanium, vanadium, or alloys thereof.

The dimensions or size of the first substrate 204 are also configurable based on the type of and desired dimensions of the electronic device 200. For example, the width and length of the base 206 of the first substrate 204, as measured along the x-axis and y-axis, respectively, may be within a range of 1-100 mm, 5-50 mm, 10-30 mm, or 5-20 mm. The height of the base 206 of the first substrate 204, as measured along the z-axis, may be within a range of 0.01-1 mm, 0.1-1 mm, 0.01-0.5 mm, or 0.1-0.5 mm.

The width of the first and second walls 208, 210 of the first substrate 204, as measured along the x-axis, respectively, may be within a range of 0.01-1 mm, 0.1-1 mm, 0.01-0.5 mm, or 0.1-0.5 mm. The length of the first and second walls 208, 210 of the first substrate 204, as measured along the y-axis, respectively, may be within a range of 0.1-50 mm, 0.1-20 mm, 1-10 mm, or 1-5 mm. The height of the first and second walls 208, 210 of the first substrate 204, as measured along the z-axis, may be within a range of 0.01-2 mm, 0.1-1 mm, 0.01-0.5 mm, or 0.1-0.5 mm.

The locking mechanism 202 also includes a cavity 214 provided in a volume formed by the first side wall 208, the second side wall 210, and the surface 212 of the base 206. The cavity 214 is configured to receive a detachable component of the electronic device 200 to join or lock two components together.

The dimensions or volume of the cavity 214 are configurable, e.g., based on the dimensions of the component configured to be inserted into the cavity. For example, the distance between the inner surfaces of the first and second walls (as measured along the x-axis), may be within a range of 0.1-2 mm, 0.1-1 mm, or 0.1-0.5 mm.

The locking mechanism 202 also includes a cantilevered plate 216 having a first end 218 and a second, opposite end 220. The cantilevered plate 216 is attached to the first side wall 208 of the first substrate 204 (e.g., chassis) at or adjacent to the first end 218 of the cantilevered plate 216.

The second end 220 of the cantilevered plate 216 is positioned with the cavity 214 of the locking mechanism 202.

The cantilevered plate 216 may be attached to the first side wall 208 by any known or later developed mechanism. For example, the cantilevered plate 216 may be adhered to the side wall 208 via an adhesive layer positioned between the plate 216 and side wall 208. Alternatively, or additionally, the cantilevered plate 216 may be secured to the side wall 208 via one or more screws, nails, bolts, or similar devices.

The cantilevered plate 216 may be attached to the first side wall 208 at an angle such that the second, non-attached end 220 of the cantilevered plate 216 is positioned within the cavity 214 closer to the base 206 of the first substrate 204 than the first end 218 of the cantilevered plate 216 (as measured along the z-axis). In other words, the cantilevered plate 216 is positioned at an acute angle greater than 0 degrees and less than 90 degrees (or between 30-60 degrees, or between 40-50 degrees) as measured between a plane formed by the surface 212 of the base 206 of the first substrate 204 (e.g., chassis) and a plane formed by the cantilevered plate 216. This arrangement is advantageous in allowing the cantilevered plate 216 to attach and retain a mating component (discussed below) of the electronic device 200, while also allowing the cantilevered plate 216 to bend and move out of the locked position into an unlocked position to remove the mating component. Such movement may not be possible if the cantilevered plate 216 is positioned at an angle parallel with or perpendicular to the surface 212 of the base 206 of the first substrate 204.

The cantilevered plate 216 may be any known or later developed material that is configured to repeatedly move between a first, extended position (as depicted in FIG. 2) and a second, bent position (as depicted in FIG. 4, discussed in greater detail below). In other words, the composition or material of the cantilevered plate 216 has elastic properties that allows the second, non-attached end 220 of the cantilevered plate 216 to move from a straight or extended position to a bent or curved position when a force is applied to the second end 220, and then spring back or return to the straight or extended position after the force is removed. This is advantageous in providing a locking mechanism that is configured to move between a locked position (with the cantilevered plate in the first, extended position) and an unlocked position (with the cantilevered plate in the bent or curved position).

In certain examples, the cantilevered plate 216 includes a magnetic composition. The magnetic composition of the cantilevered plate 216 may be a metallic or ferromagnetic composition such as one or more of iron, nickel, cobalt, a rare-earth metal, or alloys (e.g., steel) thereof. This is advantageous in providing a composition that is configured to be attracted to a (e.g., permanent) magnet positioned near the cantilevered plate 216 (e.g., on or adjacent to an outer surface of the electronic device). Based on the magnetic attraction between the cantilevered plate and the (e.g., permanent) magnet, the second, non-attached end 220 of the cantilevered plate 216 may bend toward the permanent magnet when the permanent magnet is placed or moved within a designed area near the cantilevered plate 216 (e.g., on the outer surface of the first substrate or chassis).

In other examples, the cantilevered plate 216 includes a plastic or polymeric composition such as a thermoplastic polymer, silicone, or polyurethane. Because the magnetic attraction is lacking between such a cantilevered plate and an external permanent magnet, a metallic or magnetic composition may be added or positioned on one or more surfaces of the cantilevered plate 216 to provide the desired magnetic attraction with the external permanent magnet, therein allowing the cantilevered plate 216 to move between the first, extended position and second, bent position. This is advantageous in providing a cantilever plate configuration that may be more easily bent than a similarly dimensioned plate made out of a metallic or ferromagnetic material. Such a composition may allow less magnetic force to move the locking mechanism between the locked and unlocked positions. Additionally, less force may be required to push one component of the device into the locked position (wherein some amount of movement of the cantilevered plate is required to allow the component to be positioned into the locked position.) Examples of such configurations with magnetic compositions attached or overlaid on the cantilever plate are provided below with reference to FIGS. 5-7.

In yet other alternative examples of a cantilever plate configuration, a magnetic attraction may not be required at all to move the cantilevered plate between the first and second positions. In such an example, the cantilever plate composition (and any attachments to the cantilevered plate as well) may be made of any known or later developed material. An example of such a cantilevered plate locking mechanism is provided below with reference to FIG. 8.

The dimensions or size of the cantilevered plate 216 are configurable based the dimensions of the electronic device 200 and the desired force required to move the cantilevered plate 216 between the first, extended position and the second, bent position. For example, the cantilevered plate 216 may include one or more cutouts from or near the second, non-attached end 220 of the plate to reduce the amount of force required to move the plate between the first and second positions. An example of such a configuration is discussed with reference to FIG. 7 below. In other examples, the thinness or height of the cantilevered plate may be configured based on the type of material of the cantilevered plate. That is, a metallic or magnetic composition may require a thinner dimensioned plate than a plastic or polymeric composition to provide a similarly desired force. In some examples, the height of the cantilevered plate 216 may be within a range of 0.01-1 mm, 0.1-1 mm, 0.01-0.5 mm, or 0.1-0.5 mm.

The width and length of the cantilevered plate 216 are also configurable. The width of the cantilevered plate 216 as measured between the first end 218 and second end 220 of the plate 216 may be within a range of 0.1-3 mm, 0.1-2 mm, 0.1-1 mm, or 0.1-0.5 mm. The length of cantilevered plate 216, as measured along the y-axis, may be within a range of 0.1-50 mm, 0.1-20 mm, 1-10 mm, or 1-5 mm.

As depicted in FIGS. 2-4, the electronic device 200 includes a second substrate 222 configured to be attached to the first substrate 204 via the locking mechanism 202. The second substrate 222 has a first surface 224, and a second surface 226. The second substrate 222 may be an exterior component of the electronic device 200 such that the first surface 224 of the second substrate 222 is an external surface of the electronic device 200.

The second substrate 222 may be a display module such as described above with reference the example of FIG. 1. Alternatively, the second substrate 222 may be an input module or input device, such as a keyboard or touchpad. Alternatively, in examples where the first substrate 204 is a display module or input module, the second substrate 222 may be an external backing layer or chassis, or an internal substrate of the electronic device 200.

As depicted in FIGS. 2-4, a mating component 228 is attached to or extends from the second or interior surface 226 of the second substrate 222. In some examples, the mating component 228 is attached to the second substrate 222 via an intermediate adhesive layer. In other examples, the mating component 228 is an extruded or non-detachable part of the second substrate 222. The mating component 228 is configured to be positioned within the cavity 214 of the locking component 202 such that a first side 230 of the mating component 228 is configured to abut the cantilevered plate 216, and a second, opposite side 232 of the mating component 228 is configured to abut a surface of the second wall 210 extending from the first substrate 204. This positioning is advantageous in retaining the mating component 228 within the cavity 214 in a locked position with minimal or no free play of the second substrate 222.

The mating component 228 includes a notch or recess 234 within a surface of the first side 230 of the mating component 228. The notch 234 is configured to receive a portion of the second end 220 of the cantilevered plate 216 within the cavity 214, such that the second end 220 of the cantilevered plate 216 is adjacent to or abuts the surface of the mating component 228 within the notch 234. FIG. 3 depicts an example of the second end 220 of the cantilevered plate 216 positioned within the notch 234 of the mating component 228 in a locked position.

The dimensions of the notch 234 are configurable to fit the second end 220 of the cantilevered plate 216, secure the cantilevered plate 216 in a locked position, prevent the second substrate 222 from being removed during normal operation of the electronic device 200, and allow the second substrate 222 to be removed when the cantilevered plate 216 is moved from the first, extended position into the second, bent position. The height of the notch 234, as measured along the z-axis, may be within a range of 0.01-1 mm, 0.1-1 mm, 0.01-0.5 mm, or 0.1-0.5 mm. The length of the notch 234, as measured along the y-axis, may be as large as the length of the cantilevered plate. The length of the notch 234, as measured along the y-axis, may be within a range of 0.1-50 mm, 0.1-20 mm, 1-10 mm, or 1-5 mm.

Additionally, the depth of the notch 234 (as measured along the x-axis) is configured to be deep enough to securely retain the cantilevered plate 216 in the locked position (wherein attempts to remove the second substrate 222—without moving the cantilevered plate into the second, bent position—would be unsuccessful). At the same time, the depth of the notch 234 is configured to be shallow enough such that movement of the cantilevered plate 216 into the second, bent position moves the second end 220 of the cantilevered plate 216 out of the notch 234, therein allowing the second substrate 222 to be readily removed.

FIG. 4, in particular, depicts an example of a cross-sectional side view of a cantilevered plate of a locking mechanism being bent using an external magnet 236. A user may position the magnet 236 near an outer surface 238 of the electronic device 200, e.g., on or adjacent to the outer surface 238 of the first substrate 204 or chassis. The magnet 236 may be positioned on or adjacent to the base 206 (as depicted in FIG. 4) or a side wall 208 of the first substrate 204. A magnetic attraction between the cantilevered plate 216 (or an attachment on the cantilevered plate) and the magnet 236 pulls the second, non-attached end 220 of the cantilevered plate 216 toward the magnet 236. This magnetic attraction bends the cantilevered plate 216, moving the second end 220 out of the notch 234 of the mating component 228—therein moving the locking mechanism 202 of the electronic device 200 between the locked position (see FIG. 3) and the unlocked position (see FIG. 4).

The dimensions and strength of the magnetic field of the magnet 236 are also configurable. Specifically, the magnet 236 may be configured in shape and strength to provide a magnetic attraction force within a desired range to move the cantilevered plate 216 between the locked and unlocked positions without damaging the cantilevered plate 216 or any other component of the electronic device 200.

The magnet 236 may be made of any variety of materials now known or later developed that is capable of magnetically attracting the cantilevered plate 216 (or an attachment of the cantilevered plate) toward the magnet. In certain examples, the magnet 236 is a permanent magnet, which is an object made from a material that is magnetized and provides its own persistent magnetic field. The magnet 236 may include one or more metals or metal alloys such as one or more of iron, nickel, cobalt, a rare-earth metal, or alloys (e.g., steel) thereof.

As noted above, FIGS. 5-8 provide additional examples of cantilever plate configurations within locking mechanisms of electronic devices.

Figure 5:
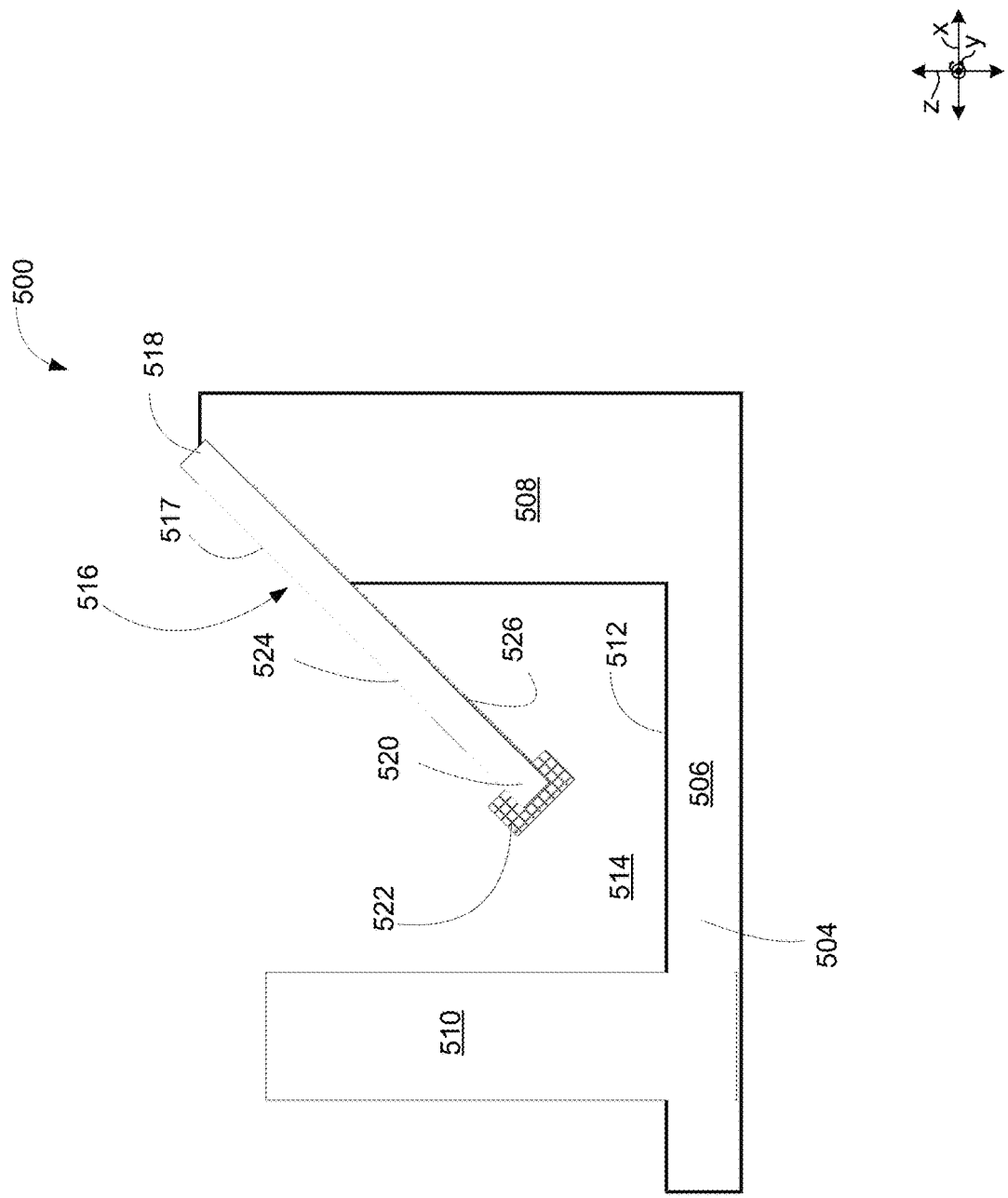
FIG. 5 depicts an example of a cantilevered plate of a locking mechanism.

For example, FIG. 5 depicts a locking mechanism 500 including a first substrate 504 or chassis having a base 506, a first side wall 508 extending from a surface 512 of the base 506, and a second side wall 510 extending from the surface 506 of the base 506. The locking mechanism 500 also includes a cavity 514 provided in a volume formed by the first side wall 508, the second side wall 510, and the surface 512 of the base 506, wherein the cavity 514 is configured to receive a mating component of the electronic device. The locking mechanism 500 also includes a cantilevered plate 516 having a base plate 517 having a first end 518 and a second, opposite end 520, wherein the cantilevered plate 516 is attached to the first side wall 508 of the chassis 504 at or adjacent to the first end 518 of the base plate 517, and wherein the second end 520 of the base plate 517 is positioned with the cavity 514.

The cantilevered plate 516 also includes a cover or overlay composition 522 that at least partially covers the second end 520 of the base plate 517. The cover or overlay composition 522 may be positioned on at least a portion of a first surface 524 of the base plate 517 and at least a portion of a second, opposite surface 526 of the base plate 517. This cover or overlay composition 522 may be advantageous in protecting the second end 520 of the cantilevered plate 516 from damage or wear and tear as the cantilevered plate 516 moves between the locked and unlocked positions.

In certain examples, the base plate 517 of the cantilevered plate 516 is made of a plastic or polymeric composition such as a thermoplastic polymer, silicone, or polyurethane. In such an example, the cover or overlay composition 522 may be a metallic or magnetic cover or overlay composition. The metallic or magnetic cover composition may be a ferromagnetic composition such as one or more of iron, nickel, cobalt, a rare-earth metal, or alloys (e.g., steel) thereof. This configuration may be advantageous in providing a cantilever plate configuration having a base plate 517 that may be more easily bent than a similarly dimensioned plate made out of a metallic or ferromagnetic material, while also providing a magnetic cover or overlay composition 522 that may be attracted to the external permanent magnet, therein allowing the cantilevered plate 516 to bend between the locked and unlocked positions.

The dimensions of the cover or overlay composition 522 are configurable. In some examples, the overlay 522 is positioned on less than 25%, less than 10%, less than 5% less than 1%, between 1-25%, between 1-10%, or between 1-5% of the first and second surfaces of the base plate, respectively. The thickness or height of the cover or overlay composition 522 on a surface 524, 526 of the base plate 517, as measured from the surface of the base plate in a direction perpendicular from the surface, may be in a range of 0.01-1 mm, 0.01-0.5 mm, or 0.01-0.1 mm.

Figure 6:
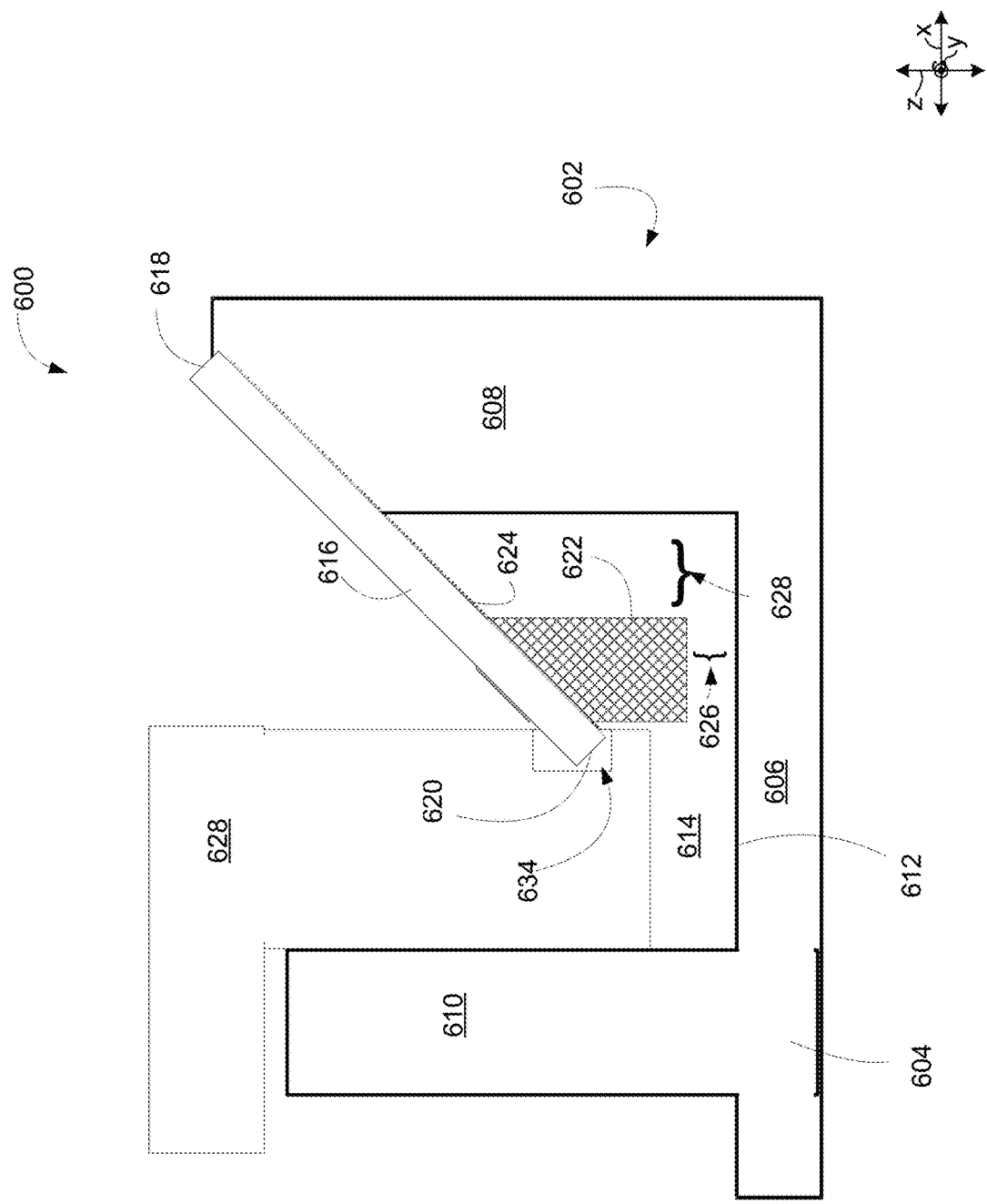
FIG. 6 depicts a cross-sectional view of additional example of a cantilevered plate of a locking mechanism.
Figure 7:
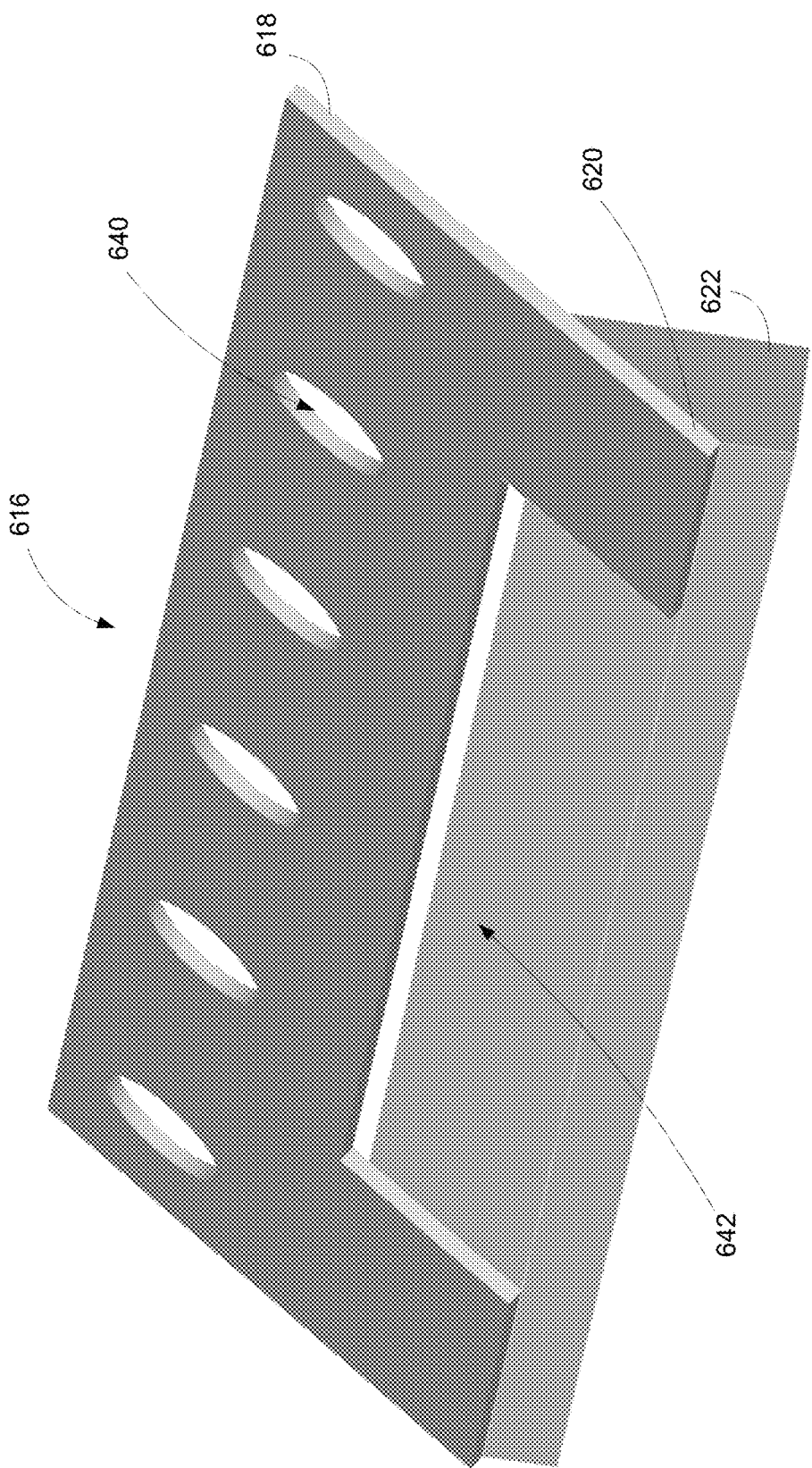
FIG. 7 depicts an isometric view of the cantilevered plate of FIG. 6.

FIGS. 6 and 7 depict an additional example of an electronic device 600 having a locking mechanism 602. FIG. 6 depicts a locking mechanism 602 including a first substrate 604 or chassis having a base 606, a first side wall 608 extending from a surface 612 of the base 606, and a second side wall 610 extending from the surface 612 of the base 606. The locking mechanism 602 also includes a cavity 614 provided in a volume formed by the first side wall 608, the second side wall 610, and the surface 612 of the base 606, wherein the cavity 614 is configured to receive a mating component 628 of the electronic device 600. The locking mechanism 602 also includes a cantilevered plate 616 having a first end 618 and a second, opposite end 620, wherein the cantilevered plate 616 is attached to the first side wall 608 of the chassis 604 at or adjacent to the first end 618 of the plate 616, and wherein the second end 620 of the plate 616 is positioned with the cavity 614.

An extension 622 is attached to or extends from a surface 624 of the cantilevered plate 616. The extension 622 may be adhered to the surface 624 of the cantilevered plate 616 via an intermediate adhesive material. In other examples, the extension 622 is bolted, nailed, screwed, or otherwise attached to the surface 624 of the cantilevered plate 616. In yet other examples, the extension 622 is part of or extruded from a same composition as the cantilevered plate 616.

The extension 622 may be positioned at or adjacent to the second end 620 of the cantilevered plate 616. In some examples, the extension 622 is positioned between the cantilevered plate 616 and the base 606 of the chassis 604.

In some examples, the cantilevered plate 616 may be made of a plastic or polymeric composition such as a thermoplastic polymer, silicone, or polyurethane, while the extension 622 may be a metallic or magnetic composition. The extension 622 may be a ferromagnetic composition such as one or more of iron, nickel, cobalt, a rare-earth metal, or alloys (e.g., steel) thereof. This configuration may be advantageous in providing a cantilevered plate 616 that may be more easily bent than a similarly dimensioned plate made out of a metallic or ferromagnetic material, while also providing an attached magnetic composition that may be attracted to the external permanent magnet, therein allowing the cantilevered plate 616 to bend between the locked and unlocked positions. Additionally, this configuration may provide a stronger magnetic attraction near the second end 620 of the cantilevered plate 616 based on the concentration of metallic material within the extension near the second end 620 of the cantilevered plate 616.

The dimensions of the extension 622 are configurable. The height of the extension, as measured along the z-axis, may be in a range of 0.01-5 mm, 0.1-1 mm, or 0.1-0.5 mm. The width of the extension 622, as measured along the x-axis, respectively, may be within a range of 0.01-1 mm, 0.1-1 mm, 0.01-0.5 mm, or 0.1-0.5 mm. The length of the extension 622 may be the entire length, or a fraction thereof, of the cantilevered plate 616. The length of the extension 622, as measured along the y-axis, respectively, may be within a range of 0.1-50 mm, 0.1-20 mm, 1-10 mm, or 1-5 mm.

A first gap 626 is configured to be present between the bottom 622 of the extension and the surface 612 of the base 606 of the first substrate 604 to allow the extension to move toward the surface 612 of the base 606 as the cantilevered plate 616 bends between the first, extended position and second, bent position. The height of first gap 626 (as measured along the z-axis) is configured to be equal to or greater than the depth of the notch 634, such that the extension 622 does not constrict the movement of the cantilevered plate 616 and prevent the second substrate from being removable.

A second gap 628 is also configured to be present between a side of the extension 622 and the surface of the first side wall 608 of the first substrate 604 to allow the extension 622 to move toward the first side wall 608 as the cantilevered plate 616 bends between the first, extended position and second, bent position. The width of second gap 628 (as measured along the x-axis) is configured to be equal to or greater than the depth of the notch 634, such that the extension 622 does not constrict the movement of the cantilevered plate 616 and prevent the second substrate from being removable.

FIG. 7 depicts an isometric view of the cantilevered plate 616 in FIG. 6. As shown in FIG. 7, the extension 622 may extend the entire length of the cantilevered plate 616. Additionally, the cantilevered plate 616 may include one or more openings 640 near the first side 618 of the plate 616. A screw, nail, or bolt may be inserted into each opening 640 to attach the cantilevered plate 616 to the wall of the substrate.

The cantilevered plate 616 may include a cutout or opening 642 between one side of the plate and the second side of the plate 616. As noted above, this configuration may be advantageous in reducing the amount of force required to move the cantilevered plate 616 between the first, extended position and the second, bent position.

Figure 8:
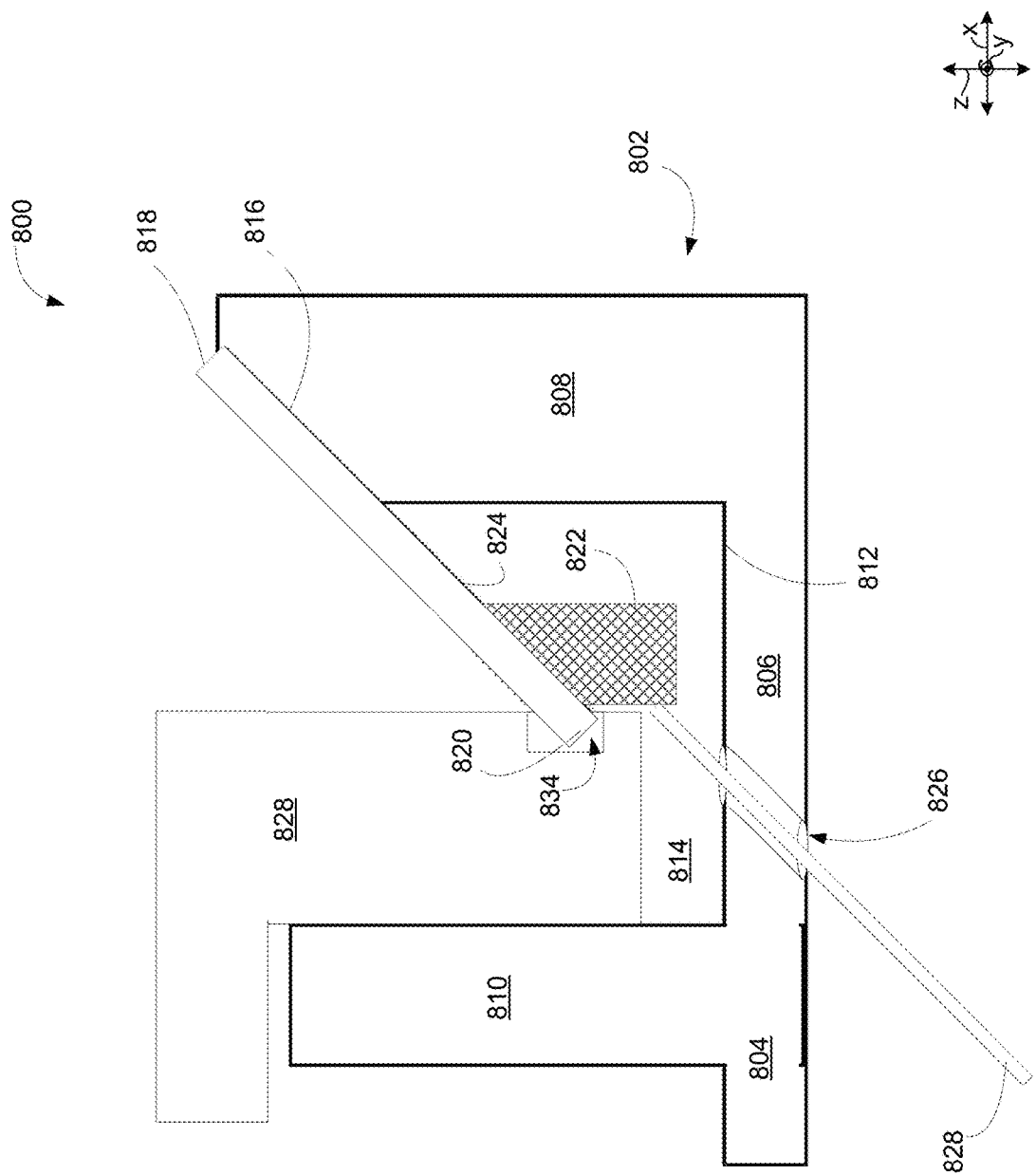
FIG. 8 depicts an example of a cross-sectional side view of a cantilevered plate being bent by inserting an external object through an opening in the chassis of the electronic device.

FIG. 8 depicts an alternative example of an electronic device 800 having a locking mechanism 802 with a cantilevered plate having an extension. Specifically, FIG. 8 depicts a locking mechanism 802 of an electronic device 800 that includes a first substrate or chassis 804 having a base 806, a first side wall 808 extending from a surface 812 of the base 806, and a second side wall 810 extending from the surface 812 of the base 806. The locking mechanism 802 also includes a cavity 814 provided in a volume formed by the first side wall 808, the second side wall 810, and the surface 812 of the base 806, wherein the cavity 814 is configured to receive a mating component 828 of the electronic device 800. The locking mechanism 802 also includes a cantilevered plate 816 having a first end 818 and a second, opposite end 820, wherein the cantilevered plate 816 is attached to the first side wall 808 of the chassis 804 at or adjacent to the first end 818 of the plate 816, and wherein the second end 820 of the plate 816 is positioned with the cavity. The locking mechanism 802 also includes an extension 822 attached to or extending from a surface 824 of the cantilevered plate 816.

In this example, the cantilevered plate 816 may be made of a plastic or polymeric composition such as a thermoplastic polymer, silicone, or polyurethane. The extension 822 may also be made of a plastic or polymeric composition such as a thermoplastic polymer, silicone, or polyurethane.

In this locking mechanism 802, an opening or hole 826 is positioned in the chassis 804. The opening 826 is configured to allow an external object 828 to be inserted through the hole 826 to apply a force against the extension 822, therein bending the cantilevered plate 816 and move the plate 816 between the locked and unlocked positions. This configuration is advantageous in providing an alternative to bending the cantilevered plate 816 without a magnet. This may allow for lighter materials to be used within the locking mechanism 802 (e.g., the cantilevered plate and extension may be made of lighter weight compositions), therein providing a lighter weight electronic device.

The dimensions of the opening 826 are configurable to allow the external object 828 to be inserted through the opening 826. In some examples, a cover may be positioned over the external opening 826 to hide or disguise the feature of the electronic device 800.

Additionally, the external object 828 may refer to any object that could be inserted into the opening and provide enough force to move the extension and cantilevered plate from the locked to the unlocked position. Certain non-limiting examples include rigid elongated objects such as a stylus, pin, rod, stick, dowel, or bar. Additionally, malleable objects (e.g., clay or putty) may also be pushed through the opening 826 to contact and move the extension and cantilevered plate 816 from the locked to the unlocked position.

Figure 9:
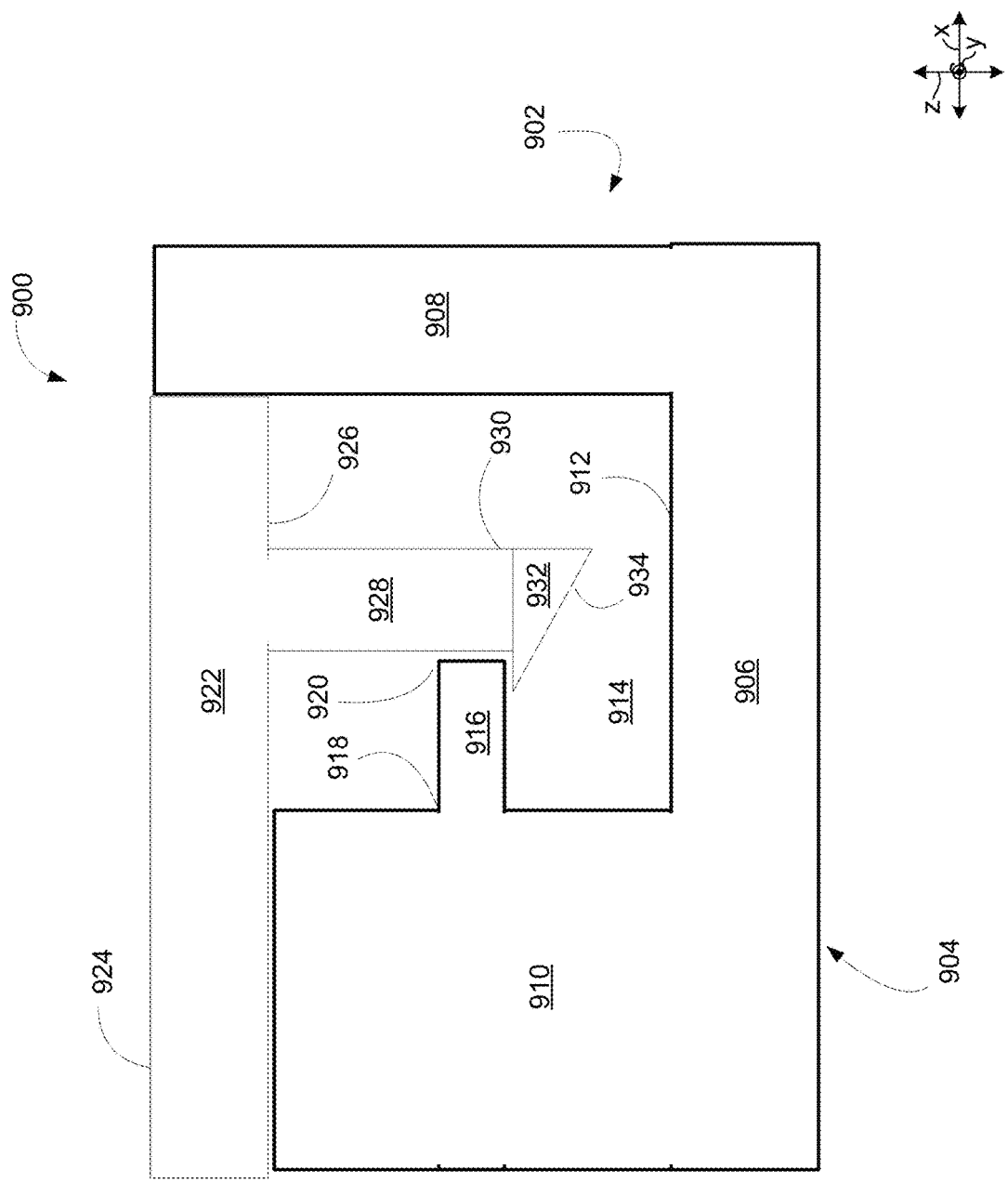
FIG. 9 depicts an additional example of a cross-sectional side view of a locking mechanism in a locked position.
Figure 10:
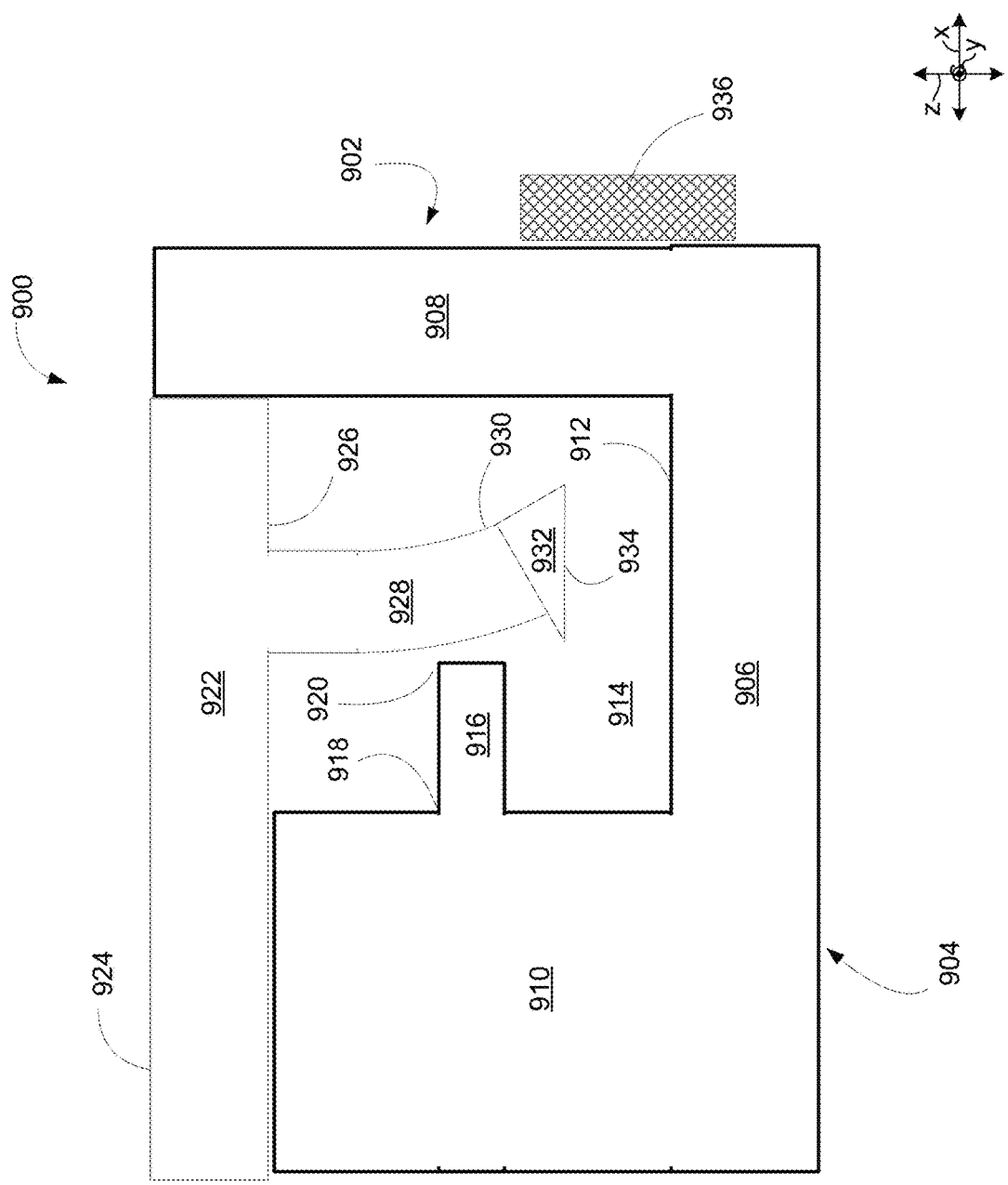
FIG. 10 depicts an additional example of a cross-sectional side view of the locking mechanism of FIG. 9 in an unlocked position.

FIGS. 9 and 10 depict an alternative example of a cross-sectional side view of a locking mechanism 1002 of an electronic device 1000 wherein the locking mechanism is configured to move via the mating component, and not the cantilevered plate. FIG. 9 depicts the electronic device in a locked position, and FIG. 10 depicts the electronic device in an unlocked position.

As depicted in FIGS. 9 and 10, the locking mechanism 902 includes a first substrate 904 having a base 906, a first side wall 908 extending from a surface 912 of the base 906, and a second side wall 910 extending from the surface 912 of the base 906.

The first substrate 904 may be a chassis or backing layer of the electronic device. Alternatively, the first substrate 904 may be a display module or input device. Alternatively, the first substrate 904 may be an internal substrate or layer of the electronic device 900.

The composition and dimensions of the first substrate 904 may be similar to those discussed above with reference to FIGS. 2-4.

In FIG. 9, the locking mechanism 902 also includes a cavity 914 provided in a volume formed by the first side wall 908, the second side wall 910, and the surface 912 of the base 906. The cavity 914 is configured to receive a detachable component of the electronic device 900 to join or lock two components together.

The locking mechanism 902 also includes a retaining device 916 configured to receive or secure a portion of the mating component of the electronic device. In one example, the retaining device is a cantilevered plate or latch 916 extending from a surface of the side wall 910. In another alternative example, the retaining device is a notch or cavity positioned within a surface of the side wall 910 of the first substrate 904, wherein the notch is configured to receive and secure a portion of the mating component (similar to the notch or cavity in the mating component depicted and described in FIGS. 2-4).

In FIGS. 9 and 10, the cantilevered plate or latch 916 has a first end 918 and a second, opposite end 920. The latch 916 is attached to the second side wall 910 of the first substrate 904 (e.g., chassis) at or adjacent to the first end 918 of the latch 916. The second end 920 of the latch 916 is positioned with the cavity 914 of the locking mechanism 902.

The latch 916 may be attached to or extrude from the second side wall 910 by any known or later developed mechanism. For example, the latch 916 may be adhered to the side wall 910 via an adhesive layer positioned between the latch 916 and side wall 910. Alternatively, or additionally, the latch 916 may be secured to the side wall 910 via one or more screws, nails, bolts, or similar devices.

The dimensions of the latch 916 are configurable based the dimensions of the electronic device 900. In other words, the dimensions of the latch (or notch) may be configurable based on the orientation and size of the mating component 928. In some examples, the height of the latch 916, as measured along the z-axis, may be within a range of 0.01-10 mm, 0.1-5 mm, 0.1-1 mm, or 0.1-0.5 mm. The width of the latch 916 as measured between the first end 918 and second end 920 of the latch 916 may be within a range of 0.1-3 mm, 0.1-2 mm, 0.1-1 mm, or 0.1-0.5 mm. The length of latch 916, as measured along the y-axis, may be within a range of 0.1-50 mm, 0.1-20 mm, 1-10 mm, or 1-5 mm.

As depicted in FIGS. 9 and 10, the electronic device 900 includes a second substrate 922 configured to be attached to the first substrate 904 via the locking mechanism 902. The second substrate 922 has a first surface 924, and a second surface 926. The second substrate 922 may be an exterior component of the electronic device 900 such that the first surface 924 of the second substrate 922 is an external surface of the electronic device 900.

The second substrate 922 may be a display module such as described above with reference the example of FIG. 1. Alternatively, the second substrate 922 may be an input module or input device, such as a keyboard or touchpad. Alternatively, in examples where the first substrate 904 is a display module or input module, the second substrate 922 may be an external backing layer or chassis, or an internal substrate of the electronic device 900.

As depicted in FIGS. 9 and 10, a mating component 928 is attached to or extends from the second or interior surface 926 of the second substrate 922. In some examples, the mating component 928 is attached to the second substrate 922 via an intermediate adhesive layer. In other examples, the mating component 928 is an extruded or non-detachable part of the second substrate 922.

The mating component 928 may be any known or later developed material that is configured to repeatedly move between a first, extended position (as depicted in FIG. 9) and a second, bent position (as depicted in FIG. 10, discussed in greater detail below). In other words, the composition or material of the mating component 928 has elastic properties that allows the non-attached end 930 of the mating component 928 to move from a straight or extended position to a bent or curved position when a force is applied to the end 930, and then spring back or return to the straight or extended position after the force is removed. This is advantageous in providing a locking mechanism that is configured to move between a locked position (with the mating component in the first, extended position) and an unlocked position (with the mating component in the bent or curved position).

An extension 932 is attached to or extends from the end 930 of the mating component 928. At least a portion of the extension 932 is configured to be positioned within the cavity 914 between the latch 916 and the surface 912 of the base 906. This is advantageous in retaining the first and second substrates, as the second substrate cannot be moved upward in the z-direction.

The extension 932 may be adhered to the end 930 of the mating component 928 via an intermediate adhesive material. In other examples, the extension 932 is bolted, nailed, screwed, or otherwise attached to the end 930 of the mating component. In yet other examples, the extension 932 is part of or extruded from a same composition as the mating component 928.

In yet other examples, the extension 932 is a cover or overlay composition that at least partially covers the end 930 of the mating component 928 (such as described in the example of FIG. 5). The extension may be an overlay composition that is positioned adjacent to the end 930 of the mating component on at least a portion of one surface of the mating component (adjacent to the latch 916) and at least a portion of a second, opposite surface of the mating component. This arrangement may be advantageous in protecting the end 930 of the mating component 928 from damage or wear and tear as the mating component 928 moves between the locked and unlocked positions.

In certain examples, the mating component 928 and/or extension 932 includes a magnetic composition. The magnetic composition of the mating component 928 and/or extension 932 may be a metallic or ferromagnetic composition such as one or more of iron, nickel, cobalt, a rare-earth metal, or alloys (e.g., steel) thereof. This is advantageous in providing a composition that is configured to be attracted to a (e.g., permanent) magnet positioned near the mating component or extension (e.g., on or adjacent to an outer surface of the electronic device). Based on the magnetic attraction between the mating component 928 or extension 932 and the (e.g., permanent) magnet, the non-attached end 930 of the mating component 928 may bend toward the permanent magnet when the permanent magnet is placed or moved within a designed area near the mating component 928 or extension 932 (e.g., near the side wall 908 of the first substrate or chassis).

In some examples, the mating component 928 may be made of a plastic or polymeric composition such as a thermoplastic polymer, silicone, or polyurethane, while the extension 932 may be a metallic or magnetic composition. The extension 932 may be a ferromagnetic composition such as one or more of iron, nickel, cobalt, a rare-earth metal, or alloys (e.g., steel) thereof. This configuration may be advantageous in providing a mating component 928 that may be more easily bent than a similarly dimensioned plate made out of a metallic or ferromagnetic material, while also providing an attached magnetic composition that may be attracted to the external permanent magnet, therein allowing the mating component 928 to bend between the locked and unlocked positions. Additionally, this configuration may provide a stronger magnetic attraction near the end 930 of the mating component 928 based on the concentration of metallic material within the extension 932 near the end 930 of the mating component 928.

In yet other alternative examples of a mating component/extension configuration, a magnetic attraction may not be required at all to move the mating component between the first and second positions. In such an example, the mating component composition (and any attachments to the cantilevered plate as well) may be made of any known or later developed material. In such an example, the mating component and extension are moved via an external object inserted through an opening in the chassis (such as described in FIG. 8).

The dimensions of the extension 932 are configurable. In particular, the extension 932 may have an angled surface 934 that advantageously allows the second substrate 922 and mating component to be more easily positioned in the locked position (as depicted in FIG. 9). The height of the extension 932, as measured along the z-axis, may be in a range of 0.01-5 mm, 0.1-1 mm, or 0.1-0.5 mm. The width of the extension 932, as measured along the x-axis, respectively, may be within a range of 0.01-1 mm, 0.1-1 mm, 0.01-0.5 mm, or 0.1-0.5 mm. The length of the extension 932 may be the entire length, or a fraction thereof, of the mating component 928. The length of the extension 932, as measured along the y-axis, respectively, may be within a range of 0.1-50 mm, 0.1-20 mm, 1-10 mm, or 1-5 mm.

The mating component 928 is configured to be positioned within the cavity 914 of the locking component 902 such that a surface of the mating component 928 is configured to abut the second end 920 of the latch 916. Additionally, one end of the second substrate 922 may be configured to abut an interior surface of the first side wall 908. This positioning is advantageous in retaining the mating component 928 within the cavity 914 in a locked position with minimal or no free play of the second substrate 922.

FIG. 10, in particular, depicts an example of a cross-sectional side view of a mating component being bent using an external magnet 936. A user may position the magnet 936 near an outer surface of the electronic device 900, e.g., on or adjacent to the side wall 908 (as depicted in FIG. 10) or the base 906 of the first substrate 904 or chassis. A magnetic attraction between the mating component (or an attachment/extension on the mating component) and the magnet 936 pulls the non-attached end 930 of the mating component 928 toward the magnet 938. This magnetic attraction bends the mating component 928, moving the end 930 away from the latch 916 (or, alternatively, out of a notch or cavity) of the side wall 910 of the chassis 904—therein moving the locking mechanism 902 of the electronic device 900 between the locked position (see FIG. 9) and the unlocked position (see FIG. 10).

The dimensions and strength of the magnetic field of the magnet 936 are also configurable. Specifically, the magnet 936 may be configured in shape and strength to provide a magnetic attraction force within a desired range to move the mating component 928 between the locked and unlocked positions without damaging the mating component 928 or any other component of the electronic device 900.

As noted above, the magnet 936 may be made of any variety of materials now known or later developed that is capable of magnetically attracting the mating component 928 216 (or an attachment/extension of the mating component) toward the magnet. In certain examples, the magnet 936 is a permanent magnet. The magnet 936 may include one or more metals or metal alloys such as one or more of iron, nickel, cobalt, a rare-earth metal, or alloys (e.g., steel) thereof.

Figure 11:
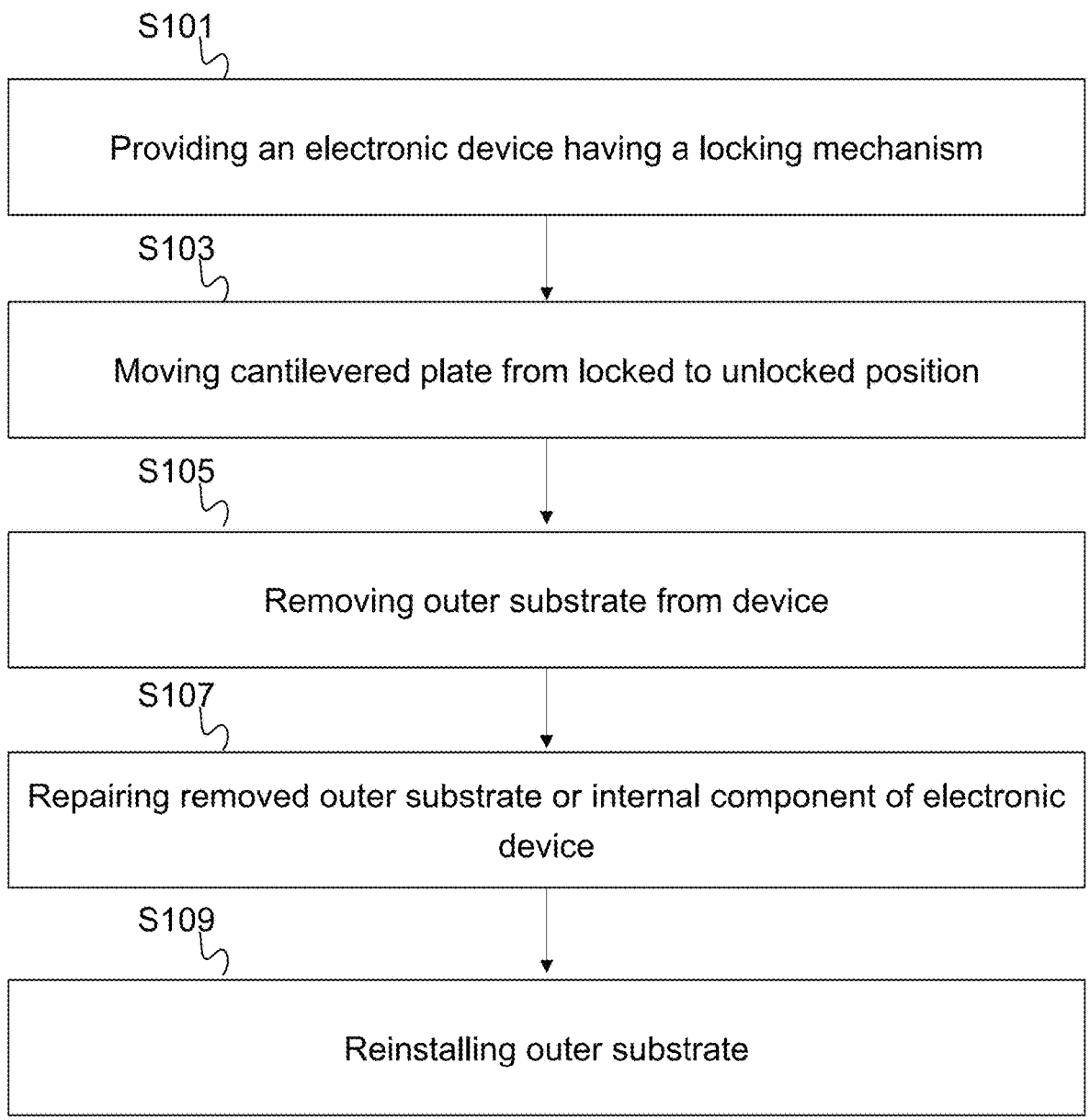
FIG. 11 is a flow diagram of a method of removing a component of an electronic device from the remainder of the device.

FIG. 11 is a flow diagram of a method of removing a component of an electronic device from the remainder of the device. In act S101, an electronic device having a locking mechanism is provided. The electronic device includes a first substrate (e.g., a chassis or backing layer) having a base, a first side wall extending from a surface of the base, and a second side wall extending from the surface of the base. A cavity is provided in a volume formed by the first side wall, the second side wall, and the surface of the base. The electronic device also includes a cantilevered plate having a first end and a second, opposite end, wherein the cantilevered plate is attached to the first side wall of the chassis at or adjacent to the first end, and wherein the second end of the cantilevered plate is positioned with the cavity. The electronic device also includes a second substrate (e.g., a display module or input device) having an exterior surface and an interior surface. A mating component is attached to or extends from the interior surface of the display module and is positioned within the cavity. The mating component has a notch in a surface of the mating component, wherein the notch receives a portion of the second end of the cantilevered plate within the cavity, and wherein the second substrate (e.g., display or input device) is secured to the first substrate (e.g., chassis or backing layer) in a locked position.

In act S103, the cantilevered plate is moved between the locked position to an unlocked position. As noted above, the cantilevered plate may be moved into the unlocked position by positioning a permanent magnet on or adjacent to an outer surface of the first substrate (e.g., chassis or backing layer) of the electronic device, wherein the second end of the cantilevered plate bends based on a magnetic attraction between the cantilevered plate and the permanent magnet. Alternatively, an external object may be inserted through an opening in the first substrate (e.g., chassis) to contact the cantilevered plate or an extension attached to the cantilevered plate. In such an example, the second end of the cantilevered plate is configured to bend and move into the unlocked position via a force applied by the external object on the cantilevered plate or extension.

In act S105, the first or second outer substrate (e.g., display module or input device) may be physically removed from the remainder of the electronic device by a user.

In act S107, a portion of the electronic device (e.g., the outer substrate or an internal component) may be repaired or replaced. As noted above, this process is advantageous in readily removing and replacing a damaged or broken outer substrate (such as a cracked display module) or an internal component without physically damaging other components of the electronic device during the removal and reinstallation process.

In act S109, the second outer substrate (e.g., the display module or input device) having the mating component attached to an inner surface may reinstalled. The mating component is positioned within the cavity of the locking mechanism. A force is applied on the cantilevered plate by the mating component as the mating component is moved into the locked position. The applied force bends the cantilevered plate until the cantilevered plate springs back into an elongated position with the second end of the cantilevered plate positioned within the notch of the mating component.

Figure 12:
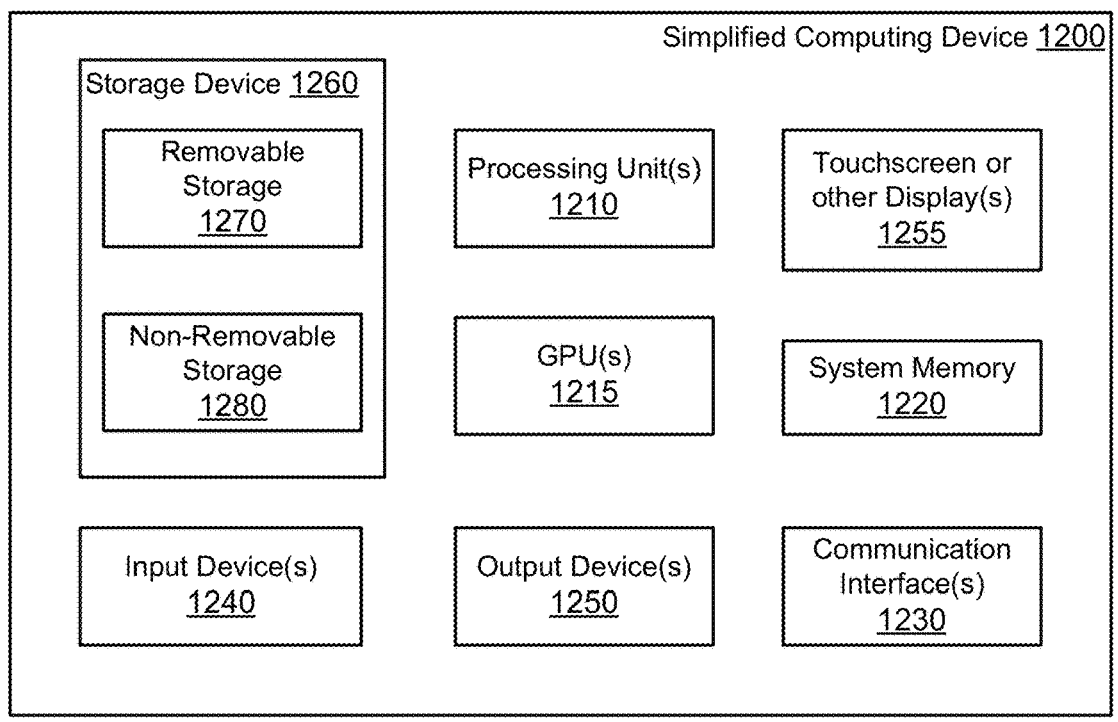
FIG. 12 is a block diagram of a computing environment in accordance with one example of a hybrid electronic device or a component of a hybrid electronic device described herein.

Regarding FIG. 12, the devices described above may be incorporated within an exemplary computing environment 1200. The computing environment 1200 may correspond with one of a wide variety of electronic or computing devices, including, but not limited to, personal computers (PCs), server computers, tablet and other handheld computing devices, laptop or mobile computers, communications devices such as mobile phones, multiprocessor systems, microprocessor-based systems, set top boxes, programmable consumer electronics, network PCs, minicomputers, mainframe computers, or audio or video media players. In certain examples, the computing device may be a wearable electronic device, wherein the device may be worn on or attached to a person's body or clothing. The wearable device may be attached to a person's shirt or jacket; worn on a person's wrist, ankle, waist, or head; or worn over their eyes or ears. Such wearable devices may include a watch, heart-rate monitor, activity tracker, or head-mounted display.

The computing environment 1200 has sufficient computational capability and system memory to enable basic computational operations. In this example, the computing environment 1200 includes one or more processing unit(s) 1210, which may be individually or collectively referred to herein as a processor. The computing environment 1200 may also include one or more graphics processing units (GPUs) 1215. The processor 1210 and/or the GPU 1215 may include integrated memory and/or be in communication with system memory 1220. The processor 1210 and/or the GPU 1215 may be a specialized microprocessor, such as a digital signal processor (DSP), a very long instruction word (VLIW) processor, or other microcontroller, or may be a general-purpose central processing unit (CPU) having one or more processing cores. The processor 1210, the GPU 1215, the system memory 1220, and/or any other components of the computing environment 1200 may be packaged or otherwise integrated as a system on a chip (SoC), application-specific integrated circuit (ASIC), or other integrated circuit or system.

The computing environment 1200 may also include other components, such as, for example, a communications interface 1230. One or more computer input devices 1240 (e.g., pointing devices, keyboards, audio input devices, video input devices, haptic input devices, or devices for receiving wired or wireless data transmissions) may be provided. The input devices 1240 may include one or more touch-sensitive surfaces, such as track pads. Various output devices 1250, including touchscreen or touch-sensitive display(s) 1255, may also be provided. The output devices 1250 may include a variety of different audio output devices, video output devices, and/or devices for transmitting wired or wireless data transmissions.

The computing environment 1200 may also include a variety of computer readable media for storage of information such as computer-readable or computer-executable instructions, data structures, program modules, or other data. Computer readable media may be any available media accessible via storage devices 1260 and includes both volatile and nonvolatile media, whether in removable storage 1270 and/or non-removable storage 1280. Computer readable media may include computer storage media and communication media. Computer storage media may include volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium, which may be used to store the desired information and which may be accessed by the processing units of the computing environment 1200.

While the present claim scope has been described with reference to specific examples, which are intended to be illustrative only and not to be limiting of the claim scope, it will be apparent to those of ordinary skill in the art that changes, additions and/or deletions may be made to the disclosed embodiments without departing from the spirit and scope of the claims.

The foregoing description is given for clearness of understanding only, and no unnecessary limitations should be understood therefrom, as modifications within the scope of the claims may be apparent to those having ordinary skill in the art.

Claim Support Section

In a first embodiment, a locking mechanism for an electronic device includes a chassis having a base, a first side wall extending from a surface of the base, and a second side wall extending from the surface of the base; a cavity provided in a volume formed by the first side wall, the second side wall, and the surface of the base, wherein the cavity is configured to receive a mating component of the electronic device; and a cantilevered plate having a first end and a second, opposite end, wherein the cantilevered plate is attached to the first side wall of the chassis at or adjacent to the first end, and wherein the second end of the cantilevered plate is positioned with the cavity, wherein the cantilevered plate is configured to bend at or adjacent to the second end, therein moving between a locked position and an unlocked position, wherein the mating component of the electronic device is securable in the locked position and removable in the unlocked position.

In a second embodiment, an electronic device includes a chassis having a base, a first side wall extending from a surface of the base, and a second side wall extending from the surface of the base; a cavity provided in a volume formed by the first side wall, the second side wall, and the surface of the base; a cantilevered plate having a first end and a second, opposite end, wherein the cantilevered plate is attached to the first side wall of the chassis at or adjacent to the first end, wherein the second end of the cantilevered plate is positioned with the cavity, and wherein the cantilevered plate is configured to bend at or adjacent to the second end, therein moving between a locked position and an unlocked position; and a substrate having a mating component extending from a surface of the substrate, wherein the mating component is positionable within the cavity, and wherein the substrate is securable in the locked position and removable in the unlocked position.

In a third embodiment, with reference to the first or second embodiment, the cantilevered plate comprises a magnetic composition, and the cantilevered plate is configured to bend via placement of a permanent magnet adjacent to an external surface of the chassis based on a magnetic attraction between the cantilevered plate and the permanent magnet.

In a fourth embodiment, with reference to embodiments 1-3, the cantilevered plate comprises a plastic base plate and metallic cover composition positioned at the second end of the cantilevered plate, wherein the metallic cover composition covers at least a portion of a first surface of the plastic base plate and at least a portion of a second, opposite surface of the plastic base plate.

In a fifth embodiment, with reference to embodiments 1-4, the locking mechanism includes an extension attached to or extending from a surface of the cantilevered plate at or adjacent to the second end of the cantilevered plate, wherein the extension is positioned between the cantilevered plate and the base of the chassis.

In a sixth embodiment, with reference to the fifth embodiment, the extension is a magnetic composition, and the cantilevered plate is configured to bend via placement of a permanent magnet adjacent to an external surface of the chassis based on a magnetic attraction between the extension and the permanent magnet.

In a seventh embodiment, with reference to embodiments 1-6, the chassis includes an opening configured to receive an external object insertable through the opening of the chassis, and the cantilevered plate is configured to bend via a force applied by the external object on the extension.

In an eighth embodiment, with reference to embodiments 1-7, the cantilevered plate is positioned at an acute angle greater than 0 degrees and less than 90 degrees as measured between a plane formed by the surface of the base of the chassis and a plane formed by the cantilevered plate.

In a ninth embodiment, with reference to embodiments 1-8, the mating component includes a notch in a surface of the mating component, wherein the notch is configured to receive a portion of the second end of the cantilevered plate and secure the mating component in the locked position.

In a tenth embodiment, with reference to embodiments 1-9, the substrate comprises a display module or an input device.

In an eleventh embodiment, with reference to embodiments 1-10, the substrate is an external surface of the electronic device.

In a twelfth embodiment, a locking mechanism for an electronic device includes a chassis having a base, a first side wall extending from a surface of the base, and a second side wall extending from the surface of the base; a cavity provided in a volume formed by the first side wall, the second side wall, and the surface of the base; a mating component having a first end attached to a substrate and a second, opposite end positionable within the cavity; a retaining device positioned on the first or second side wall, wherein the retaining device is configured to receive a portion of the mating component within the cavity and secure the mating component in a locked position, wherein the mating component is configured to bend at or adjacent to the second end, therein moving the locking mechanism between the locked position and an unlocked position, wherein the substrate and mating component are removable from the chassis in the unlocked position.

In a thirteenth embodiment, with reference to the twelfth embodiment, the mating component comprises an extension attached to or extending the second end of the mating component, and the extension is positionable within the retaining device of the first side wall or positionable between the retaining device of the first side wall and the base of the chassis.

In a fourteenth embodiment, with reference to the twelfth or thirteenth embodiment, the extension is a magnetic composition, and the mating component is configured to bend via placement of a permanent magnet adjacent to an external surface of the chassis based on a magnetic attraction between the extension and the permanent magnet.

In a fifteenth embodiment, with reference to embodiments 12-14, the retaining device is a notch positioned within a surface of the first or second side wall, or a latch extending from the surface of the first or second side wall.

What is claimed is:
1. An electronic device with a locking mechanism, the electronic device comprising;
    a chassis having a first outer substrate and a second outer substrate, a first side wall extending from a surface of a base of the first outer substrate near a periphery of the electronic device, and a second side wall extending from the surface of the first outer substrate parallel to the first side wall;
    a mating component of the electronic device extending from a surface of a base of the second outer substrate near the periphery of the electronic device;
    a cavity provided in a volume formed by the first side wall, the second side wall, and the surface of the first outer substrate near the periphery of the electronic device, wherein the cavity is configured to receive the mating component of the electronic device, at least a portion of the mating component received within the cavity of the electronic device;
    a resilient cantilevered plate having a first end and a second, opposite end, wherein the cantilevered plate is attached to the first side wall of the chassis at or adjacent to the first end, and wherein the second end of the cantilevered plate is positioned within the cavity such to lockably engage the mating component therein and such that the first outer substrate and the second outer substrate are matingly engaged to form an enclosed volume; and internal electrical components contained within the first outer substrate and the second outer substrate in the enclosed volume, wherein the cantilevered plate is configured to bend at or adjacent to the second end, therein moving between a locked position and an unlocked position, wherein the mating component of the electronic device is securable in the locked position and removable in the unlocked position, wherein the cantilevered plate comprises a magnetic composition, and wherein the cantilevered plate is configured to bend via placement of a permanent magnet adjacent to an external surface of the chassis based on a magnetic attraction between the cantilevered plate and the permanent magnet.

2. The electronic device of claim 1, wherein the cantilevered plate is positioned at an acute angle greater than 0 degrees and less than 90 degrees as measured between a plane formed by the surface of the base of the chassis and a plane formed by the cantilevered plate.

3. An electronic device comprising:
a chassis having a first outer substrate and a second outer substrate, a first side wall extending from a surface of a base of the first outer substrate near a periphery of the electronic device, and a second side wall extending from the surface of the first outer substrate parallel to the first side wall;

a cavity provided in a volume formed by the first side wall, the second side wall, and the surface of the first outer substrate near the periphery of the electronic device;

a mating component of the electronic device extending from a surface of a base of the second outer substrate near the periphery of the electronic device, at least a portion of the mating component received within the cavity of the electronic device such that the first outer substrate and the second outer substrate are matingly engaged to form an enclosed volume;

internal electrical components contained within the first outer substrate and the second outer substrate in the enclosed volume; and a resilient cantilevered plate having a first end and a second, opposite end, wherein the cantilevered plate is attached to the first side wall of the chassis at or adjacent to the first end, wherein the second end of the cantilevered plate is positioned within the cavity such to lockably engage the mating component therein, and wherein the cantilevered plate is configured to bend at or adjacent to the second end, therein moving between a locked position and an unlocked position, wherein the cantilevered plate comprises a magnetic composition, and wherein the cantilevered plate is configured to bend via placement of a permanent magnet adjacent to an external surface of the chassis based on a magnetic attraction between the cantilevered plate and the permanent magnet.

4. The electronic device of claim 3, wherein the mating component comprises a notch in a surface of the mating component, wherein the notch is configured to receive a portion of the second end of the cantilevered plate and secure the mating component in the locked position.

5. The electronic device of claim 3, wherein the substrate comprises a display module or an input device.

6. The electronic device of claim 3, wherein the substrate is an external surface of the electronic device.

7. An electronic device with a locking mechanism, the electronic device comprising:
a chassis having a first outer substrate and a second outer substrate, a first side wall extending from a surface of a base of the first outer substrate near a periphery of the electronic device, and a second side wall extending from the surface of the first outer substrate parallel to the first side wall;

a cavity provided in a volume formed by the first side wall, the second side wall, and the surface of the first outer substrate near the periphery of the electronic device;

a mating component comprising a resilient cantilevered plate having a first end attached to a surface of a base of the second outer substrate near the periphery of the electronic device and a second, opposite end positionable within the cavity;

a retaining device positioned on the first or second side wall, wherein the retaining device is configured to receive a portion of the mating component within the cavity and secure the mating component in a locked position such to lockably engage the mating component therein and such that the first outer substrate and the second outer substrate are matingly engaged to form an enclosed volume; and internal electrical components contained within the first outer substrate and the second outer substrate in the enclosed volume;

wherein the mating component is configured to bend at or adjacent to the second end, therein moving the locking mechanism between the locked position and an unlocked position, wherein the second outer substrate and the mating component are removable from the first outer substrate in the unlocked position, where the cantilevered plate comprises a magnetic composition, and wherein the cantilevered plate is configured to bend via placement of a permanent magnet adjacent to an external surface of the chassis based on a magnetic attraction between the cantilevered plate and the permanent magnet.

8. The locking mechanism of claim 7, wherein the retaining device is a notch positioned within a surface of the first or second side wall, or a latch extending from the surface of the first or second side wall.

* * * * *